US011240917B2

(12) United States Patent
Markovich et al.

(10) Patent No.: US 11,240,917 B2
(45) Date of Patent: Feb. 1, 2022

(54) PRINTING OF NANOWIRE FILMS

(71) Applicant: TECHNOLOGY INNOVATION MOMENTUM FUND (ISRAEL) LIMITED PARTNERSHIP, Tel Aviv (IL)

(72) Inventors: Gil Markovich, Tel Aviv (IL); Einat Tirosh, Ramat Gan (IL); Muriel Tzadka, Petah Tikva (IL)

(73) Assignee: TECHNOLOGY INNOVATION MOMENTUM FUND (ISRAEL) LIMITED PARTNERSHIP, Tel Aviv (IL)

( * ) Notice: Subject to any disclaimer, the term of this patent is extended or adjusted under 35 U.S.C. 154(b) by 35 days.

(21) Appl. No.: 16/091,800

(22) PCT Filed: Apr. 2, 2017

(86) PCT No.: PCT/IL2017/050398
§ 371 (c)(1),
(2) Date: Oct. 5, 2018

(87) PCT Pub. No.: WO2017/175215
PCT Pub. Date: Oct. 12, 2017

(65) Prior Publication Data
US 2019/0166699 A1 May 30, 2019

Related U.S. Application Data

(60) Provisional application No. 62/319,323, filed on Apr. 7, 2016.

(51) Int. Cl.
H05K 3/12 (2006.01)
H05K 1/09 (2006.01)
(Continued)

(52) U.S. Cl.
CPC ............ *H05K 3/125* (2013.01); *B32B 15/02* (2013.01); *H05K 1/09* (2013.01); *H05K 3/18* (2013.01);
(Continued)

(58) Field of Classification Search
USPC .......................................... 427/58, 94.6–98.6
See application file for complete search history.

(56) References Cited

U.S. PATENT DOCUMENTS 5,294,370 A   3/1994 Wichers et al.
6,774,021 B2 * 8/2004 Fukunaga ................ C25D 5/02
                                                       118/300
(Continued)

FOREIGN PATENT DOCUMENTS

EP   2 363 891 A2    9/2011
KR   2014010629   *  7/2012
(Continued)

OTHER PUBLICATIONS

Ko et al., "Digital Selective Growth of ZnO Nanowire Arrays from Inkjet-Printed Nanoparticle Seeds on a Flexible Substrate", Langmuir, 2012, vol. 28, pp. 4787-4792.
(Continued)

*Primary Examiner* — Brian K Talbot
(74) *Attorney, Agent, or Firm* — Vorys, Sater, Seymour and Pease LLP; Anthony Venturino

(57) ABSTRACT

Provided is a novel printing process for fabricating metallic, conductive and transparent ultra-thin nanowires and patterns including same on a substrate. The process includes two different controllable steps, each designed to achieving a useful and efficient pattern.

13 Claims, 9 Drawing Sheets

(51) Int. Cl.
| | |
|---|---|
| H05K 3/18 | (2006.01) |
| B32B 15/02 | (2006.01) |
| H05K 3/24 | (2006.01) |
| H05K 1/03 | (2006.01) |

(52) U.S. Cl.
CPC ........... *H05K 3/244* (2013.01); *H05K 1/0306* (2013.01); *H05K 1/0326* (2013.01); *H05K 1/0333* (2013.01); *H05K 1/0346* (2013.01); *H05K 1/0386* (2013.01); *H05K 1/092* (2013.01); *H05K 3/1208* (2013.01); *H05K 2201/0116* (2013.01); *H05K 2201/0145* (2013.01); *H05K 2201/0158* (2013.01); *H05K 2201/026* (2013.01); *H05K 2201/10053* (2013.01); *H05K 2201/10121* (2013.01); *H05K 2201/10128* (2013.01); *H05K 2201/10151* (2013.01); *H05K 2201/10166* (2013.01); *H05K 2203/013* (2013.01); *H05K 2203/1157* (2013.01); *H05K 2203/1163* (2013.01)

(56) References Cited

U.S. PATENT DOCUMENTS

| | | | |
|---|---|---|---|
| 7,083,104 | B1 | 8/2006 | Empedocles et al. |
| 8,455,048 | B1 | 6/2013 | Fan et al. |
| 9,373,515 | B2 | 6/2016 | Markovich et al. |
| 2006/0169788 | A1 | 8/2006 | Empedocles et al. |
| 2006/0196309 | A1 | 9/2006 | Niidome et al. |
| 2006/0267595 | A1 | 11/2006 | Bohannan et al. |
| 2007/0074316 | A1 | 3/2007 | Alden et al. |
| 2007/0077187 | A1 | 4/2007 | Kirkegaard |
| 2008/0088219 | A1 | 4/2008 | Yoon et al. |
| 2008/0143906 | A1 | 6/2008 | Allemand et al. |
| 2008/0286447 | A1 | 11/2008 | Alden et al. |
| 2009/0130433 | A1 | 5/2009 | Takada |
| 2011/0162870 | A1* | 7/2011 | Markovich ......... C23C 18/1676 174/126.1 |
| 2011/0253668 | A1 | 10/2011 | Winoto et al. |
| 2013/0112969 | A1* | 5/2013 | Kim .................. H01L 21/02579 257/43 |
| 2013/0149844 | A1* | 6/2013 | Kim .................. H01L 21/02472 438/478 |
| 2014/0234157 | A1* | 8/2014 | Chen ..................... B22F 1/0025 420/507 |
| 2015/0104936 | A1* | 4/2015 | Markovich .............. H01B 1/02 438/610 |
| 2016/0268013 | A1 | 9/2016 | Markovich et al. |

FOREIGN PATENT DOCUMENTS

| | | |
|---|---|---|
| WO | 2009/035059 A1 | 3/2009 |
| WO | 2010/026571 A2 | 3/2010 |
| WO | 2010/130986 A1 | 11/2010 |
| WO | 2013/128458 A1 | 9/2013 |

OTHER PUBLICATIONS

Ni et al., "Electroless nanowelding of silver nanowires at room temperature", RSC Adv., 2014, vol. 4, pp. 40330-40338.
Parmar et al., "In situ formation of silver nanowire networks on paper", Current Science, vol. 107, No. 2, pp. 262-269, (2014).
Ahn et al., Transparent conductive grids via direct writing of silver nanoparticle inks. Nanoscale 2011. pp. 2700-2702. The Royal Society of Chemistry.
Azulai et al., Transparent Metal Nanowire Thin Films Prepared in Mesostructured Templates. Nano Letters. Sep. 17, 2009. pp. 4246-4249. vol. 9, No. 12. American Chemical Society. Tel Aviv.
Azulai et al., On-Surface Formation of Metal Nanowire Transparent Top Electrodes on CdSe Nanowire Array-Based Photoconductive Devices. ACS Applied Materials & Interfaces. 2012. pp. 3157-3162. Tel Aviv.
Azulai et al., Seed Concentration Control of Metal Nanowire Diameter. Nano Letters. Oct. 3, 2012. pp. 5552-5558. ACS Publications. Tel Aviv.
Belenkova et al., UV induced formation of transparent Au—AG nanowire mesh film for repairable OLED devices. Journal of Materials Chemistry. Sep. 20, 2012. pp. 24042-24047.The Royal Society of Chemistry. Tel Aviv.
Krichevski et al., Formation of Gold-Silver Nanowires in Thin Surfactant Solution. Dec. 1, 2005. pp. 867—Langmuir. vol. 22. No. 3. Tel Aviv.
Persoons. An experimental study on the preparation of gold nanoparticles and their properties. Copyright Faculteit Wetenschappen, Departement Chemie, ISBN 90-8649-007-7; 2006.
Zheng et al., Controlling synthesis of silver nanowires and dendrites in mixed surfactant solutions. Journal of Colloid and Interface Science. Sep. 19, 2003. pp. 357-361. Elsevier. People's Republic of China.
Jana et al., Wet Chemical Synthesis of High Aspect Ratio Cylindrical Gold Nanorods. J. Phys. Chem. Mar. 30, 2001. pp. 4065-4067. American Chemical Society. Columbia, South Carolina.
Murphy et al., One-Dimensional Colloidal Gold and Silver Nanostructures. Inorganic Chemistry Article. Nov. 9, 2005. pp. 7544-7554. vol. 45. No. 19. Columbia, South Carolina.
De et al., Silver Nanowire Networks as Flexible, Transparent, Conducting Films: Extremely High DC to Optical Conductivity Ratios. 2009. pp. 1767-1774. vol. 3. No. 7. ACS NANO. Ireland.
Several—Definition of several by the Free Dictionary; four pages; accessed on Mar. 29, 2016; available at http://www.thefreedictionary.com/several.
Huo et al., Sub-Two Nanometer Single Crystal Au Nanowires. Jun. 7, 2008. pp. 2041-2044. American Chemical Society. vol. 8. No. 7. California.
Hubert et al., Cetyltrimethylammonium Bromide Silver Bromide Complex as the Capping Agent of Gold Nanorods. Langmuir. Jul. 7, 2008. pp. 9219-9222. vol. 24. No. 17.
Kang et al., Nanoimprinted Semitransparent Metal Electrolodes and Their Application in Organic Light-Emitting Diodes. Advanced Materials Journal. vol. 19. pp. 1391-1396, 2007.
Kumar et al., The Race to Replace Tin-Doped Indium Oxide: Which Material Will Win? Perspective article. 2010. vol. 4. No. 1. pp. 11-14. ACS Nano.
Kuo et al., Synthesis of Branched Gold Nanocrystals by a Seeding Growth Approach. Langmuir. Jan. 22, 2005. pp. 2012-2016. American Chemical Society. Taiwan.
Layani et al., Flexible transparent conductive coatings by combining self-assembly with sintering of silver nanoparticles performed at room temperature. Journal of Materials Chemistry. Jul. 27, 2011. pp. 15378-15382. vol. 21. The Royal Society of Chemistry.
Lee et al., Control of Current Saturation and Threshold Voltage Shift in Indium Oxide Nanowire Transistors with Femtosecond Laser Annealing. ACS Nano. Jan. 11, 2011. pp. 1095-1101. vol. 5. No. 2. Republic of Korea.
Lu et al., Continuous formation of suported cubic and hexagonal mesoporous films by sol-gel dip-coating. Letters to Nature. Sep. 25, 1997. pp. 364-368. vol. 389. Macmillan Publishers Ltd.
Lyons et al., High-Performance Transparent Conductors from Networks of Gold Nanowires. Nov. 18, 2011. pp. 3058-3062. vol. 2. Switzerland.
Mortier et al., Two-step synthesis of high aspect ratio gold nanorods. Central European Journal of Chemistry. Oct. 17, 2005. pp. 160-165. vol. 4. No. 1. Leuven. Belgium.
Nagai et al., Electric Conductivity-Tunable Transparent Flexible Nanowire-Filled Polymer Composites: Orientation Control of Nanowires in a Magnetic Field. May 30, 2011. pp. 2341-2348. vol. 3. No. 7. Japan.
Niidome et al., Rapid synthesis of gold nanorods by the combination of chemical reduction and photoirradiation processes; morphological changes depending on the growing processes. Chem Comm. Aug. 18, 2003. The Royal Society of Chemistry. Japan.
Perez-Juste et al., Electric-Field-Directed Growth of Gold Nanorods in Aqueous Surfactant Solutions. Advanced Functional Materials. 2004. vol. 14. No. 6. pp. 571-579.

(56) References Cited

OTHER PUBLICATIONS

Rathmell et al., The Growth Mechanism of Copper Nanowires and Their Properties in Flexible, Transparent Conducting Films. Advanced Materials. vol. 22. 2010. pp. 3558-3563.

Rathmell et al., The Synthesis and Coating of Long, Thin Copper Nanowires to Make Flexible, Transparent Conducting Films on Plastic Substrates. Advanced Materials. vol. 23. 2011. pp. 4798-4803.

Reddy et al., Synthesis and cathodoluminescense properties of CdSe/ZnO hierachical nanostructures. Journal of Materials Chemistry. vol. 21. 2011. pp. 3858-3864.

Lee et al., Solution-Processed Metal Nanowire Mesh Transparent Electrodes. Nano Letters. vol. 8. No. 2. pp. 689-692 (2008).

Kang et al., Organic Solar Cells Using Nanoimprinted Transparent Metal Electrodes. Advanced Materials. vol. 20. 2008. pp. 4408-4413.

Hellstrom et al., Polymer-Assisted Direct Deposition of Uniform Carbon Nanotube Bundle Networks for High Performance Transparent Electrodes. ACS Nano. vol. 3. No. 6. 2009. pp. 1423-1430.

Lu et al., Ultrathin Gold Nanowires Can be Obtained by Reducing Polymeric Strands of Oleylamine-AuCl Complexes Formed Via Aurophilic Interaction. J. Am. Chem. Soc. vol. 130. No. 28. 2008. pp. 8900-8901.

Wang et al., Ultrathin Au Nanowires and Their Transport Properties. J. Am. Chem. Soc. vol. 130. pp. 8902-8903 (2008).

Huo et al., Sub-Two Nanometer Single Crystal Au Nanowires. Nano Letters. (2008). vol. 8. No. 7. pp. 2041-2044.

Pazos-Perez et al., Synthesis of Flexible, Ultrathin Gold Nanowires in Organic Media. Langmuir. vol. 24. 2008. pp. 9855-9860.

Krichevski et al., Growth of Au/Ag nanowires in thin surfactant solution films: An electron microscopy study. J. Colloid Interface Sci. vol. 314. 2007. pp. 304-309.

Krichesvski et al., Growth of Colloidal Gold Nanostars and Nanowires Induced by Palladium Doping. Langmuir. vol. 23. 2007 pp. 1496-1499.

Jana et al., Liquid crystalline assemblies of ordered gold nanorods. J. Mater. Chem. vol. 12. 2002. pp. 2909-2912.

Stawinski et al., Synthesis and Alignment of Silver Nanorods and Nanowires and the Formation of Pt, Pd and Core/Shell Structures by Galvanic Exchange Directly on Surfaces. Langmuir. vol. 23. No. 20. 2007. pp. 10357-10365. Abstract Only.

Taub et al., Growth of Gold Nanorods on Surfaces. Journal Phys. Chem. B. vol. 107. No. 45. pp. 11579-11582, (2003).

Tvingstedt et al., Electrode Grids for Ito-Free Organix Photovoltaic Devices. Advanced Materials. vol. 19. 2007. pp. 2893-2897.

Wang et al., Facile Synthesis of Ultrathin and Single Crustalline Au Nanowires. Chemistry—An Asian Journal. Jul. 6, 2009, pp. 1028-1034. Abstract Only.

Zeng et al., A New Transparent Conductor: Silver Nanowire Film Buried at the Surface of a Transparent Polymer. Advanced Materials. vol. 19. 2007. pp. 2893-2897.

Qian et al., Silver Seeds and Aromatic Surfactants Facilitate the Growth of Anisotropic Metal Nanoparticles: Gold Triangular Nanoprisms and Ultrathin Nanowires. Chem. Mater. 2014. 26, pp. 6172-6177.

Zhu et al., Transparent Conductors from Carbon Nanotubes LBL—Assembled with Polymer Dopant with Electron Transfer. J. Am. Chem. Soc. vol. 133. No. 19. 2011. pp. 7450-7460. Abstract Only.

Zhu et al., Reductive-Oxidation Electrogenerated Chemiluminescense (ECL) Generation at a Transparent Silver Surfactant Solutions; Journal of Colloid Interface Science. vol. 27. No. 6. 2011. pp. 3121-3127. Abstract Only.

Zijsltra et al., High-Temperature Seedless Synthesis of Gold Nanrods. J. Phys. Chem. B. vol. 110. 2006. pp. 19315-19318.

\* cited by examiner

Figure 9A
Figure 9B
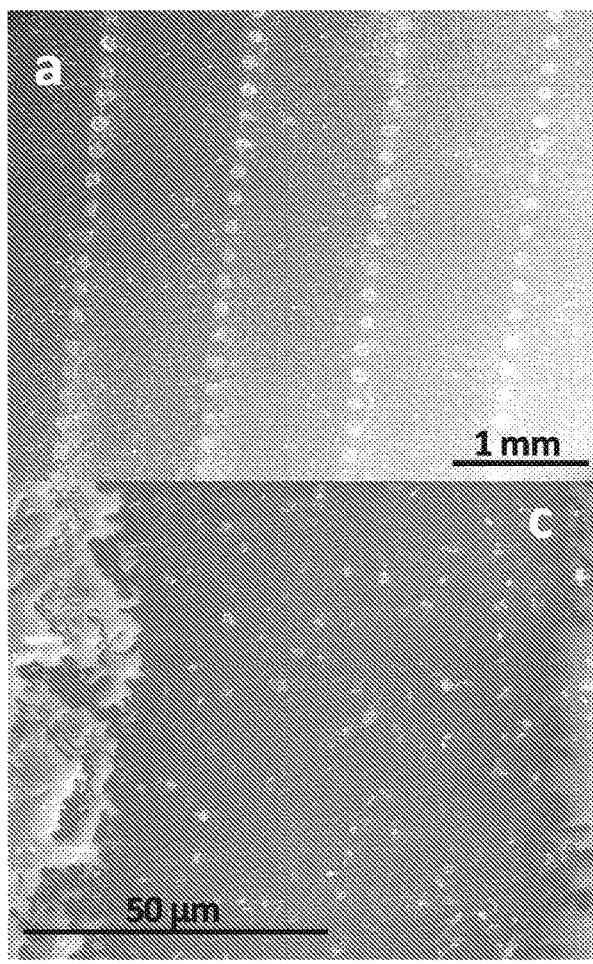
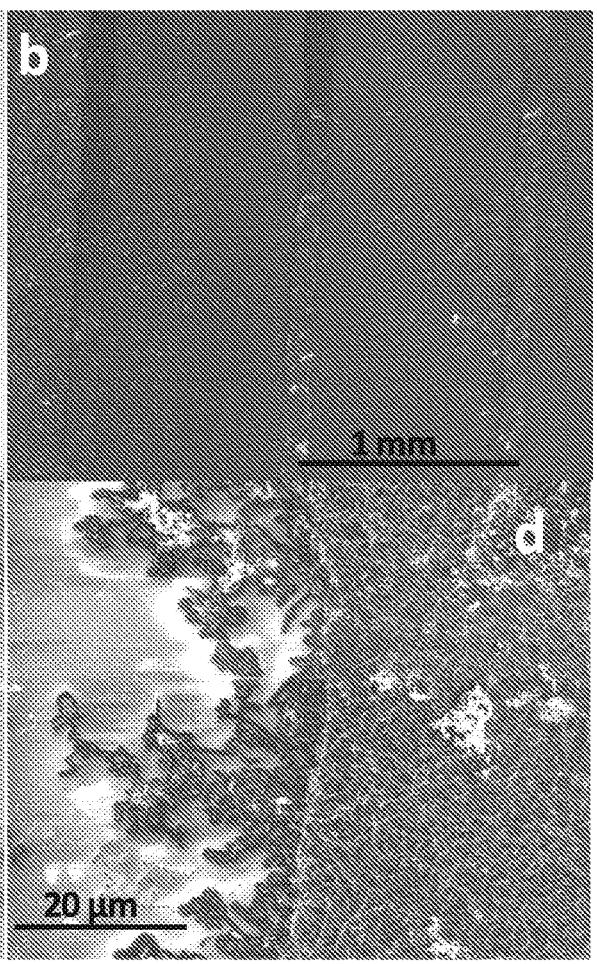
Figure 9C
Figure 9D

PRINTING OF NANOWIRE FILMS

TECHNOLOGICAL FIELD

The invention generally concerns methods of printing nanowires on solid substrate materials.

BACKGROUND

A major interest exists among various companies in developing next generation displays and finding replacements for Indium Tin Oxide (ITO) as a transparent electrode material that is an essential part of displays, touch screens, and OLED illumination devices. This interest is driven at least by the desire to avoid the need for indium, which is a rare element, to avoid expensive vacuum-based sputtering coating techniques and to produce highly flexible panels.

One major candidate to replace ITO films is random metal nanowire mesh films that can be produced by simple wet deposition processes. Many research schemes follow the main stream of this technology, where polymer coated metal nanorods (Ag, Cu), with relatively high aspect ratios, are synthesized by known chemical processes, purified and deposited as thin films on various substrates.

Markovich et al [1] teaches a conductive nanowire film based on a high aspect-ratio metal is disclosed. The nanowire film is produced by inducing metal reduction in a concentrated surfactant solution containing metal precursor ions, a surfactant and a reducing agent.

In a subsequent application, Markovich et al [2] presents a process for preparation of a conductive film comprising metal nanowires having large aspect ratios. The process involves a surfactant/template assisted method which utilizes a precursor solution comprising a surfactant, a metal precursor and a reducing agent, that is spread onto a surface to induce formation of nanowires.

BACKGROUND ART

[1] WO2010/026571
[2] WO2013/128458
[3] Azulai, D.; Cohen, E.; Markovich, G. Seed Concentration Control of Metal NW Diameter. *Nano Lett.* 2012, 12, 5552-5558
[4] Zhaoxia Qian and So-Jung Park, Silver Seeds and Aromatic Surfactants Facilitate the Growth of Anisotropic Metal Nanoparticles: Gold Triangular Nanoprisms and Ultrathin Nanowires. *Chem. Mater.* 2014, 26, 6172-6177

GENERAL DESCRIPTION

Printed electronics has become a major technology in the electronic and optoelectronic industry, as it provides the ability to write electronic components and circuits, at a low cost and with ease of production. However, the printed electronics technology requires integration and optimization of many factors, including, inter alia, printing conditions (time, temperature etc.), printing formulations (stability, compatibility to the printing head, etc.), substrate (compatibility to glass, metal, plastics), form and structure of the printed pattern (controlling the obtained pattern, capability to obtain large scale printed elements, etc.) and a variety of other factors.

The inventors of the present invention have developed a novel printing process for fabricating metallic, conductive and transparent ultra-thin nanowires and patterns comprising same on a substrate. The process comprises two different controllable steps. In the first step, a solution of metal seed particles is patterned on a substrate. In the second step, a growth solution is deposited on the pattern to induce formation of a continuous metallic nanowire pattern at the location of deposition. An optional third metal deposition step may be included in order to enhance conductivity and stabilize the nanowires. The sequence of steps may be switched, achieving a useful and efficient result.

The novel process of the invention enables one or more of the following characteristics:
 1. Tightly controllable printing process.
 2. Excellent compatibility with inkjet printing technologies.
 3. High resolution printing and patterning process.
 4. Patterning precisely small features.
 5. Printing on any substrate.
 6. In-situ synthesis in a printing mode.
 7. Stable printing solutions (inks) having long shelf-life.
 8. Compatibility to industry and industrial conditions.
 9. Process duration is not limited, for example, by the time of solution application and/or drying.
 10. Obtaining ultrathin nanowires.
 11. Obtaining a defined nanowires film.

Thus, in one of its aspects the invention provides a process for the preparation of a metallic (nanowires) pattern on a surface of a substrate, said process comprising:
(a) patterning a plurality of seeds (seed solution) on at least a region of a surface of a substrate to obtain a pattern of said seeds;
(b) applying a growth solution onto said pattern of step (a); and
(c) allowing said pattern to form into a continuous metallic (nanowires) pattern.

In another aspect, there is provided a process for the preparation of a metallic (nanowires) pattern on a surface of a substrate, said process comprising:
(a) patterning a growth solution on at least a region of a surface of a substrate;
(b) patterning a plurality of metal seeds (seed solution) onto said pattern of step (a); and
(c) allowing said pattern to form into a continuous metallic (nanowires) pattern.

In another aspect, there is provided a process for the preparation of a metallic (nanowires) pattern on a surface of a substrate, said process comprising:
(a) applying a growth solution on at least a region of a surface of a substrate;
(b) patterning a plurality of metal seeds (seed solution) onto said pattern of step (a); and
(c) allowing said pattern to form into a continuous metallic (nanowires) pattern.

In another aspect, there is provided a process for the preparation of a metallic (nanowires) pattern on a surface of a substrate, said process comprising:
(a) applying, e.g., patterning, a growth solution or a seed solution on at least a region of a surface of a substrate;
(b) applying, e.g., patterning, the other of a growth solution and a seed solution onto the solution applied and formed into the pattern of step (a); and
(c) allowing regions of the substrate onto both solutions have been applied one onto the other to form into a continuous metallic (nanowires) pattern.

In some embodiments, a process is provided for forming a metallic pattern on a surface region of a substrate, the process comprising:

(a) applying on at least one surface region of a substrate:
(i) a growth solution; or
(ii) a solution comprising metallic seeds;
(b) applying the other of said growth solution (i) and said solution comprising metallic seeds (ii) onto the solution applied in step (a); and
(c) allowing formation of a metallic pattern in regions of the surface where both solutions (i) and (ii) have been applied.

In other words, where solution (i) is applied first, solution (ii) is applied subsequently. Where solution (ii) is applied first, solution (i) is applied subsequently.

In some embodiments, the process comprises:
(a) patterning a plurality of metal seeds onto at least one surface region of a substrate to obtain a pattern of said seeds;
(b) applying a growth solution onto said pattern of step (a); and
(c) allowing said pattern to form into a metallic pattern.

In some embodiments, the process comprises:
(a) patterning a growth solution on at least one surface region of a substrate;
(b) patterning a plurality of metal seeds onto said pattern of step (a); and
(c) allowing said pattern to form into a metallic pattern.

In some embodiments, the process comprises:
(a) applying a growth solution on the surface of a substrate;
(b) patterning a plurality of metal seeds onto at least one region of the surface covered with the growth solution of step (a); and
(c) allowing said patterned surface to form into a metallic pattern.

In some embodiments, the patterning of growth solution or seed solution is pre-formed (pre-patterned).

The plurality of metal seeds may be patterned by applying onto at least a region a surface of the substrate a solution comprising metallic seeds or a plurality of seeds the solution being referred to herein as a "seed solution". The solution comprises a plurality of metal seeds, in the form of nanoparticles of at least one metal or metal precursor (metal oxide, metal salt, etc) or semiconductor materials or any combination thereof. When applying a seed solution onto a region of the substrate, the metallic seeds do not spontaneously form into a continuous conductive pattern (e.g., nanowires cannot form). To achieve a continuous metallic (nanowires) pattern, application of the growth solution is required, or at least one component contained therein, as further detailed herein, either in advance of the application of the seed solution or thereafter, onto and in contact with a plurality of seeds in the pattern. Thus, the seed solution is free of at least one of the components (precursors) necessary to render the (nanowires) pattern continuous and thus conductive and/or to form at least one nanowire. In some embodiments, the seed solution is free (or essentially free, e.g., present in an amount which does not endow formation of a continuous pattern and/or nanowires) of a metal reducing agent(s). In some embodiments, the seed solution is free (or essentially free) of a metal precursor(s). In other embodiments, the seed solution is free (or essentially free) of a metal reducing agent(s) and/or a metal precursor(s).

In other embodiments, the seed solution consists of seeds (particles) dispersed in a medium, which may or may not further contain surfactant(s) and/or other additives. In some embodiments, the seed solution comprises plurality of nanoparticles.

In some embodiments, the seed solution comprises at least one metal precursor or at least one reducing agent. In some embodiments, the seed solution comprises at least one reducing agent only in case the solution does not comprise a material that can undergo reduction into the metallic species.

The seed solution employed in the process typically comprises a plurality of seeds, namely nanoparticles (more than one nanoparticle, which may be e.g., more than one type of nanoparticles). The plurality of nanoparticles may or may not be of the same material, same shape and/or size, or same chemical and/or physical properties.

The nanoparticles are typically nanometric in size, namely at least one dimension of size (length, diameter, cross section) is in the nanometer scale. In some embodiments, the nanoparticles size is between 1 and 50 nm.

In some embodiments, the nanoparticles are sphere-like particles or substantially spherical particles of a nanometric diameter. In some embodiments, the nanoparticles are rod-like particles having a nanometric length and a nanometric diameter. In some embodiments, the seed solution contains a mixture of nanoparticle types; each type varies from the other in size and/or shape and/or composition.

The nanoparticles may be smaller than 50 nm in diameter (size, cross section). In some embodiments, the diameter is less than 30 nm; in other embodiments, less than 10 nm and in further embodiments, the diameter is between 1 and 10 nm, or 1 and 9 nm, or 1 and 8 nm, or 1 and 7 nm, or 1 and 6 nm, or 1 and 5 nm, or 1 and 4 nm, or 1 and 3 nm. In other embodiments, the nanoparticles diameter is 1 nm, or 2 nm, or 3 nm, or 4 nm, or 5 nm, or 6 nm, or 7 nm, or 8 nm, or 9 nm, or 10 nm.

The concentration of the particles in the seed solution is relatively low, so that application of only the seed solution on the substrate does not result in or form a continuous pattern, but rather a pattern characterized by dispersed nanoparticles. In some embodiments, the nanoparticles (seeds) concentration in the seed solution is below about $10^{-4}$M. In some embodiments, the nanoparticles concentration in the seed solution is below about $10^{-5}$M. In some embodiments, the nanoparticles concentration in the seed solution is below about $10^{-6}$M. In some embodiments, the nanoparticles (seeds) concentration in the seed solution is at least about $10^{-10}$ M. In some embodiments, the nanoparticles concentration in the seed solution is at least about $10^{-9}$M. In some embodiments, the nanoparticles concentration in the seed solution is at least about $10^{-8}$M. In some embodiments, the concentration is between about $10^{-10}$M and $10^{-4}$M. In other embodiments, the concentration is between about $10^{-9}$M and $10^{-5}$M.

The coverage of nanoparticles on the at least region of a substrate is such that conductive (nanowires) patterns are not obtained prior to applying the growth solution. In some embodiments, the coverage of the seed nanoparticles on the substrate is above or equal to 50 nanoparticles per square micrometer. In some embodiments, the coverage of the seed nanoparticles on the substrate is above or equal to 3 nanoparticles per square micrometer. In further embodiments, the coverage of the seed particles on the substrate is above or equal to 10 nanoparticles per square micrometer. In further embodiments, the coverage of the seed nanoparticles on the substrate is above or equal to 50 nanoparticles per square micrometer. In further embodiments, the coverage of the seed nanoparticles on the substrate is below 5,000 particles per square micrometer. In further embodiments, the coverage of the seed nanoparticles on the substrate is below or equal to 1,000 nanoparticles per square micrometer. In further embodiments, the coverage of the seed nanoparticles on the substrate is below or equal to 500 nanoparticles per square micrometer. In further embodiments, the coverage of the seed nanoparticles on the substrate is below or equal to 100 nanoparticles per a square micrometer. In some embodiments, the coverage of the seed nanoparticles on the substrate is between 3 to 5,000 nanoparticles per a square micrometer. In some embodiments, the coverage of the seed nanoparticles on the substrate is between 3 to 1,000 nanoparticles per square micrometer. In some embodiments, the coverage of the seed nanoparticles on the substrate is between 3 to 500 nanoparticles per square micrometer. In some embodiments, the coverage of the seed nanoparticles on the substrate is between 10 to 300 nanoparticles per square micrometer. In some embodiments, the coverage of the seed nanoparticles on the substrate is between 10 to 100 nanoparticles per square micrometer. In some embodiments, the coverage of the seed nanoparticles on the substrate is between 20 to 200 nanoparticles per square micrometer. In some embodiments, the coverage of the seed nanoparticles on the substrate is between 5 to 50 particles per square micrometer.

In some embodiments, the nanoparticles (seeds) are selected of a material which comprises one or more elemental metal.

In some embodiments, the seed solution comprises seeds of a material that comprises or consists a metal alloy and/or a metallic compound, e.g., a metal oxide or a metal salt, and/or semiconductors or any combination thereof. In some embodiments, the material is at least one metal or an alloy thereof.

In some embodiments, the seed solution comprises nanoparticles (seeds) of a material selected from metal salt, said salt comprising at least one metal atom selected to undergo reduction to form at least one metallic seed (zero valent).

In some embodiments, the seed solution comprises a plurality of seeds, of different types. In other words, different types of seeds may be used in a single solution. The seed types may vary in at least one of composition, size, shape, etc.

Alternatively, the seed solution may be regarded as two or more different solutions, each solution comprising a different population of seeds, e.g., population may vary in size, shape, material composition, homogeneity, uniformity, etc.

In some embodiments, the material is a material selected from elements of the Periodic Table, selected from Group I-VII, Group II-VI, Group III-V, Group IV-VI, Group and Group IV semiconductors or metals and combinations thereof.

In other embodiments, the material is a Group I-VII semiconductor, such as CuCl, CuBr, CuI, AgCl, AgBr, AgI and the like.

In other embodiments, the material is a Group II-VI material, selected from CdSe, CdS, CdTe, ZnSe, ZnS, ZnTe, HgS, HgSe, HgTe, CdZnSe, ZnO and any combination thereof.

In further embodiments, Group III-V material is selected from InAs, InP, InN, GaN, InSb, InAsP, InGaAs, GaAs, GaP, GaSb, AlP, AlN, AlAs, AlSb, CdSeTe, ZnCdSe and any combination thereof.

In additional embodiments, the material is selected from Group IV-VI materials, such as PbSe, PbTe, PbS, PbSnTe, Tl$_2$SnTe$_5$ and any combination thereof.

In other embodiments, the material is or comprises an element of Group IV. In some embodiments, the material is selected from C, Si, Ge, Sn and Pb. In some embodiments, the material is C or Si.

In some embodiments, the material is a metal, a metal alloy, or a metal oxide. Non-limiting examples include ZnO, CdO, Fe$_2$O$_3$, Fe$_3$O$_4$, and In$_2$O$_3$.

In other embodiments, the material is selected amongst metal alloys and inter-metallics of the above metals and/or transition metals.

In further embodiments, the material is selected from copper sulfides, such as Cu$_2$S, Cu$_2$Se, CuInS$_2$, CuInSe$_2$, Cu$_2$(ZnSn)S$_4$, Cu$_2$(InGa)S$_4$, CuInS$_2$, CuGaS$_2$, CuAlS$_2$ and mixed copper-iron sulfides such as Cu$_5$FeS$_4$ (Bornite) and CuFeS$_2$ (chalcopyrite).

In further embodiments, the material is a metal or a metal alloy.

In further embodiments, the material is a metal, a salt, an oxide or an alloy of a metal atom selected from Sc, Ti, V, Cr, Mn, Fe, Ni, Cu, Zn, Y, Zr, Nb, Tc, Ru, Mo, Rh, W, Au, Pt, Pd, Ag, Mn, Co, Cd, Hf, Ta, Re, Os, Ir and Hg. In some embodiments, the pattern formed is of a metal selected from gold, silver, copper, nickel, palladium or any combination thereof. In some other embodiments, the metallic pattern is of gold or silver or any combination thereof.

In further embodiments, the material is a metal, a salt, an oxide or an alloy of a metal atom selected from Ag, Au and any combination thereof. In some embodiments, the metal, a salt, an oxide or an alloy of a metal atom selected is Ag and/or Au.

In some embodiments, the seed solution comprises metallic seeds and is free of metal salts of the same or different metallic atom. In some embodiments, the metallic seeds are gold seeds, silver seeds or combination thereof.

The seed solution, as well as the growth solution, may each independently contain an organic or an inorganic liquid or carrier as a medium for making up the solution (or dispersion). In some instances, the liquid medium may comprise a combination of organic solvents and/or inorganic solvents, or may comprise a mixture of organic solvents and/or inorganic solvents together with water. In some embodiments, the medium making up the seeds solution or a growth solution, independently, is an aqueous solution (medium). In some embodiments, the solution is in fact a dispersion suitable for printing.

The "pattern of seeds" (pattern of nanoparticles) formed by application of the seed solution or seed nanoparticles on a surface region of a substrate, independently of a prior application of a growth solution may be of any shape, size or composition and may occupy any region of the substrate. The pattern shape and size, as well as the density of the seeds forming the pattern may be predefined and may be tailored according to a particular end application. In some embodiments, the pattern is randomly shaped and oriented, such that seed distribution on the surface of the substrate is random. In some embodiments, the seeds are applied or distributed on the surface of a substrate, namely patterned, to form one or more lines or structures, whereby each line or structure may be spaced apart, may be tangent to the other, may overlap, may intersect another line or structure, etc. The seed pattern may be in form of an ordered array, a mesh, a net, a line, a plurality of parallel lines or in any other desired shape. The pattern may alternatively be a complete coverage of the surface or a surface region.

As the form, structure and the morphology of a final metallic (conductive) pattern may depend, inter alia, on the combination of the applied seed solution and growth solution, the final pattern may be differently constructed (in both shape and form), to some extent, as compared with the pattern initially intended (or pattern initially formed on the substrate surface).

Independent of the shape and size of the pattern of seeds, the pattern may cover one or more regions of the surface of a substrate, such that each region is similarly or identically characterized, e.g., as having the same or different pattern size and shape, or the pattern may cover the full surface of the substrate. In some embodiments, the pattern is a single pattern or a plurality of spaced apart patterns on said substrate.

The "growth solution" comprises one or more components that can affect metallization and nanowire formation when applied onto a pattern of seeds or when seeds from the seed solution come in contact with the components. In some embodiments, the growth solution comprises at least one metal precursor and/or at least one reducing agent, which upon interaction with the metal seeds, affords a metallic and continuous pattern. The growth solution is typically free of metal seeds.

The growth solution may be applied onto a previously layered pattern of the metallic seeds, namely subsequent to the patterning of the seed solution, or prior thereto, to thereby afford a pattern that is composed of both seeds from the seed solution and at least one metal precursor and/or at least one reducing agent (and optionally further additives and components, as recited and defined, with respect to any growth solution utilized in accordance with the invention) that in combination render the pattern metallic, continuous and optionally conductive.

In some embodiments, the growth solution comprises at least one metal precursor, at least one metal reducing agent, and at least one surfactant. In some embodiments, the growth solution comprises at least one metal precursor and at least one metal reducing agent. In some embodiments, the growth solution comprises at least one metal precursor. In some embodiments, the growth solution comprises at least one metal reducing agent. In some embodiments, the growth solution comprises seeds, only in case it does not comprise a reducing agent.

The at least one metal precursor is a metal-containing material, in a form of metal ions or in a form which under the application conditions dissociates or is transformable into metal. Non-limiting examples of metal precursors are chloroauric acid, $HAuCl_4$, $NaAuCl_4$, $KAuCl_4$, as exemplary sources of gold; $AgNO_3$, silver acetate, silver lactate, silver acetylacetonate, as exemplary sources of silver; $(NH_4)_2PdCl_6$, $Na_2PdCl_4$, as exemplary sources of palladium; $Cu(NO_3)_2$, $CuCl_2$, $CuSO_4$, copper acetate, copper acetyl acetonate, as exemplary sources of copper; $NiCl_2$, $Ni(NO_3)_2$, nickel acetate, nickel acetylacetonate, as exemplary source of nickel; and $H_2PtCl_6$, $K_2PtCl_6$, $(NH_3)_2PtCl_6$, $Na_2PtCl_6$, as exemplary sources of platinum. In some embodiments, the at least one metal precursor is $HAuCl_4$ or $AgNO_3$ or any combination thereof.

In some embodiments, the at least one metal precursor is a single metal precursor. In other embodiments, the at least one metal precursor is a combination of two or more metal precursors of the same metal or of different metals.

In some embodiments, the metal precursor is a gold precursor, such as chloroauric acid. In other embodiments, the metal precursor is a combination of gold and silver metal precursors. In still further embodiments, the metal precursor is a combination of palladium, silver and/or gold metal precursors.

In some embodiments of a process of the invention, the seed solution comprises metallic (zero valency) seeds of at least one metal selected from gold metal and silver metal and at least one reducing agent selected from a metal hydride; and the growth solution comprises at least one metal precursor in a form selected as herein disclosed and at least one reducing agent and at least one surfactant. In some embodiments, the growth solution comprises at least one metal precursor in the form of a metal salt of gold and/or silver.

In some embodiments, the concentration of the at least one metal precursor is at least 0.01 mM. In some embodiments, the concentration is at least 0.05 mM. In some embodiments, the concentration is at least 0.1 mM. In some embodiments, the concentration is at least 0.3 mM. In some embodiments, the concentration is between 0.01 and 50 mM. In other embodiments, the concentration is between 0.01 and 20 mM. In other embodiments, the concentration is between 0.05 and 20 mM. In other embodiments, the concentration is between 0.05 and 10 mM.

The at least one reducing agent is an agent capable of reducing the at least one metal precursor. In some embodiments, the metal reducing agent is an inorganic reducing agent and in other embodiments, the metal reducing agent is an organic reducing agent. Non-limiting examples of such reducing agents are metal borohydride, e.g., such as sodium borohydride and other hydride derivatives, such as cyanoborohydride; a metal ascorbate such as sodium ascorbate; ascorbic acid, hydroquinone and hydroquinone derivatives, hydrazine and hydrazine derivatives, such as methylhydrazine and any combinations thereof.

In some embodiments, the at least one reducing agent is a combination of two or more agents. In some embodiments, the two or more reducing agents are different in their reducing ability; one may be a weak reducing agent (having a low reducing potential), such as a metal ascorbate, e.g., sodium ascorbate and the other may be a strong reducing agent (having a high reducing potential), such as a metal borohydride. In some embodiments, the reducing agent is one or more of a metal ascorbate and/or a metal borohydride.

In some embodiments, the combination of two or more reducing agents comprises at least one metal borohydride.

In some embodiments, the combination of two or more reducing agents comprises at least one metal ascorbate.

In some embodiments, each of the reducing agents in a combination may be provided separately. In other words, for example, one reducing agent may be comprised in the seed solution, while another may be in the growth solution. Similarly, both may be comprised in the seed solution or the growth solution, provided that if the seed solution comprises also a reducing agent, it does not comprise a metal precursor.

In some embodiments, the concentration of the reducing agent is at least 0.1 mM. In some embodiments, the concentration is at least 0.5 mM. In some embodiments, the concentration is at least 1 mM. In some embodiments, the concentration is between 0.5 and 5,000 mM. In other embodiments, the concentration is between 0.5 and 1,000 mM. In other embodiments, the concentration is between 0.5 and 500 mM. In other embodiments, the concentration is between 1 and 1,000 mM. In other embodiments, the concentration is between 1 and 500 mM.

The at least one surfactant may be a single surfactant or a mixture of two or more surfactants. The at least one surfactant may be selected amongst cationic-type surfactants, which may be quaternary ammonium materials. Such quaternary ammonium materials may comprise at least one N-alkyl group of 10 or more carbon atoms; in some embodiments, the ammonium comprises an alkyl group of at least 14 carbon atoms, e.g., 14, 16 or 18 carbon atoms. In some embodiments, the at least one surfactant is an ammonium comprising one alkyl chain of between 14 and 16 carbon atoms. In other embodiments, the at least one surfactant is a multi-chain surfactant having two or more alkyl chains, each of the alkyl chains having between 10 and 16 carbon atoms.

Non-limiting examples of the at least one surfactant utilized in accordance with the invention are benzyldimethylammonium bromide, benzyldimethyl ammonium chloride, cetyltrimethylammonium bromide (CTAB), cetyltrimethyl ammonium chloride (CTAC), didodecyldimethylammonium bromide, tetradecyltri methylammonium bromide, didecyldimethylammonium bromide, wherein the bromide counter ion, alternatively, may be a chloride or an iodide; polyvinylpyrrolidone (PVP), bovine serum albumin (BSA), benzyldimethyl hexadecyl ammonium chloride (BDAC), polyethylene glycol (PEG), gum Arabic. In some embodiments, the surfactant is benzyldimethyhexadecyllammonium bromide, benzyldimethylhexadecylammonium chloride, cetyltrimethylammonium bromide (CTAB), cetyltrimethylammonium chloride (CTAC), didodecyldimethylammonium bromide, tetradecyltrimethyl ammonium bromide, didecyldimethylammonium bromide, wherein the bromide counter ion, alternatively, may be a chloride or an iodide. In some embodiments, the surfactant is CTAB, BDAC or any combination thereof.

In some embodiments of a process of the invention, the seed solution comprises metallic (zero valency) seeds of at least one metal selected from gold metal and silver metal and at least one reducing agent selected from a metal hydride; and the growth solution comprises at least one metal precursor in a form selected as herein disclosed, at least one reducing agent and at least one surfactant. In some embodiments, the growth solution comprises at least one metal precursor in the form of a metal salt of gold and/or silver. In some embodiments, the at least one of the reducing agents utilized is ascorbic acid or a metal ascorbate. In some embodiments, the at least one surfactant is selected from BDAC and CTAB.

In some embodiments, the concentration of the at least one surfactant is above 0.01 M; in further embodiments above 0.05M; in still other embodiments above or equal to about 0.1M. In some additional embodiments, the surfactant concentration is at most 1M. In additional embodiments, the surfactant concentration is between 0.05 and 0.5M.

In some embodiments, the concentration of the at least one surfactant is above 1%, above 5%, above 10%, above 15%, or above 20%. In some embodiments, the surfactant concentration is at most 30%. In embodiments, the surfactant concentration is between 1 and 30%, between 5 and 25%, or between 7.5 and 21%.

The growth solution as well as the seed solution may each independently further comprise at least one additive. Non-limiting examples of such additives include buffers, pH adjusting agents, biocides, sequestering agents, chelating agents, corrosion inhibitors, stabilizing agents, dispersing agents, complexing agents, surfactants, humectants, co-solvents, fixatives, penetrants, surfactants, colorants, magnetic materials and others.

In some embodiments, the growth solution and the seed solution may each independently further comprise at least one additive selected from one or more of stabilizing agents, dispersing agents, complexing agents, surfactants or any combination thereof.

In some embodiments, the process of the invention may comprise a further step of forming a top layer on the film of nanowires. As noted herein, the top layer is formed by an electroless step involving applying on (coating) the patterned film of nanowires an "enhancement solution", so as to reconstruct, correct, thicken or stabilize the pre-formed pattern. In some embodiments, the enhancement solution comprises at least one metal precursor and/or at least one metal reducing agent. In some embodiments, the metal reducing agent is at least one metal ascorbate, or at least one weak reducing agent.

In some embodiments, the enhancement solution comprises at least one metal precursor and at least one metal reducing agent, which may be a weak metal reducing agent, e.g., metal ascorbate.

In some embodiments, the enhancement solution comprises at least one metal precursor and/or at least one metal reducing agent, optionally being a weak metal reducing agent and optionally further comprising at least one surfactant. In some embodiments, the reducing agent is hydroquinone.

In some embodiments, the enhancement solution comprises hydroquinone.

In some embodiments, the enhancement solution further comprises at least one surfactant. In some embodiments, the enhancement solution further comprises at least one additive. In some embodiments, the additive is a buffer component. Non-limiting examples of such buffer agents is citric acid and citrate salts.

In some embodiments, the enhancement solution is free (or essentially free) of seeds (nanoparticles). In some embodiments, the enhancement solution is free (or essentially free) of a strong metal reducing agent, such as a metal borohydride. In some embodiments, the enhancement solution is free (or essentially free) of any metal reducing agent.

The surface region of a substrate onto which the pattern is applied and formed may be a surface region of any 2-dimensional or 3-dimensional object. The substrate may be of any rigid or flexible material. The substrate may be clear (transparent; any degree of transparency) or opaque. The surface may be hydrophobic or hydrophilic in nature (or at any degree of hydrophobicity/hydrophilicity) or a surface which may be switched between the two states. The substrate and/or the surface of the substrate may be composed of glass of any kind. The substrate and/or the surface of the substrate may be composed of an organic or inorganic material such as a silicon (such as a standard, polished silicon wafer), a fused silica (such as a standard fused silica window polished to optical quality), a carbon (such as a highly oriented pyrolitic graphite), a polymer sheet (such as polycarbonate copying machine transparency film and a semiconducting polymer layer comprising the active layer of an organic light emitting diode made, for example from MEH-PPV or doped polyacetylene), or any other surface.

The substrate surface, on top of which the pattern is formed, may be any substrate which is stable or non-degradable. The substrate may be of a single material, e.g., a metal, and may have a surface material which is the same or different from the substrate material itself. The substrate and/or its surface, independently of each other, may be selected from glass, polymeric films, plain paper, porous paper, non-porous paper, coated paper, flexible paper, copier paper, photo paper, glossy photopaper, semi-glossy photopaper, heavy weight matte paper, billboard paper, vinyl paper, high gloss polymeric films, transparent conductive materials, and plastic (poly(ethylene terephthalate), PET, polyacrylates (PA), polyethylene napthalate (PEN), polyether-sulphone (PES), polyethylene (PE), polyimide (PI), polypropylene (PP), polycarbonate (PC) and others. The substrate may be a porous substrate or a smooth substrate.

In some embodiments, the process of the invention further comprises one or more steps of pre-treating the surface of the substrate and/or one or more steps of post treatment. The pre-treatment and post-treatment steps, independently, may include, in a non-limiting fashion, surface treatments, solvent or chemical or physical washing (e.g., washing by an aqueous solution or a non-liquid medium such as a gas), etching, heating (e.g. to temperatures between 25-150° C.), deposition of an optionally patterned or unpatented intermediate layer, surface treatments such as plasma treatment, UV-ozone treatment, corona discharge, Ceria treatment, and/or silanization.

In some embodiments, the pre- and/or post-treatment steps may be applied, if necessary and based on the selection of conditions and materials, before or after one or more or each step of the process of the invention are performed.

The solution(s) utilized according to the invention may be applied onto a surface region, or may be patterned on a surface region. Typically, the term "application" or any lingual variation thereof, when in connection with a solution(s) of the invention, different from the term "patterning" of the solution(s), is not intended for the purpose of limiting the application step to forming a pattern of a predefined shape and size or is not intended to forming a pattern by any one method of application. When "patterning" is used, the patterning step is intended to result in structure, a pattern, of a defined or predefined form, size, shape etc, or is limited to methods available for patterning. Any one specific patterning methods may be used in order to achieve a line pattern or generally a pattern with controlled thickness and uniformity.

Non-limiting examples of methods utilized for application of a solution according to the invention include coating, depositing, dipping, immersing, spreading, drop casting, dip- and/or spin-coating techniques, printing techniques, ink-jet printing, thermal ink-jet printing, piezoelectric ink-jet printing and continuous ink-jet printing and roller printing techniques.

Non-limiting examples of methods utilized for patterning a solution according to the invention include depositing, drop casting, printing techniques, ink-jet printing, thermal ink-jet printing, piezoelectric ink-jet printing and continuous ink-jet printing and roller printing techniques.

In some embodiments, the patterns are formed by printing. In some embodiments, the patterns are formed by ink-jet printing.

In some embodiments, where the process comprises two or more patterning steps, at least one of the patterning step is by ink-jet printing.

In some embodiments, where the pattern is in the form of a continuous film that is formed on a full surface region, the pattern may be formed by any method selected from depositing, drop casting, printing techniques, ink-jet printing, thermal ink-jet printing, piezoelectric ink-jet printing and continuous ink-jet printing and roller printing techniques.

In a process of the invention, the first patterning stage may include patterning of metal seeds on a surface region, e.g., by applying a seed solution, or by application (or patterning) of a growth solution. Patterning may be achieved by ink-jet printing in order to afford a pattern, e.g., a line pattern, with controlled properties, e.g., thickness, length, density of structures, etc. Any one of a plurality of possible subsequent steps (e.g., applying the growth solution or the seed solution, depending on the nature of the first step, and/or an enhancement solution) may be carried out also by ink-jet printing, or by any other method known in the art, e.g., selected from those recited herein (e.g. applying growth solution by deposition technique). As the seed pattern cannot spontaneously form into a continuous and conductive pattern, but requires treatment with the growth solution, and as the growth solution in it by itself cannot result in a continuous conductive pattern, upon completing the first patterning step, e.g., application of the seeds on the surface region, e.g., by ink-jet printing, the complete surface may be treated with the growth solution by employing a deposition technique or ink-jet printing or e.g., any of the alternative means recited herein. A continuous conductive pattern will form only where the initial seed pattern exists, or putting it differently, where both solutions have been applied.

The growth solution may be applied (spread, deposited or printed) over the whole surface of the substrate, regardless of whether the substrate or any region thereof is patterned with seeds. In some embodiments, the growth solution is applied only on top of the seed pattern or generally on top of regions of the seeds on the surface of the substrate, i.e., the growth solution is patterned on the surface of the substrate according to the pattern of the seeds. In some embodiments, the patterns are formed by printing, e.g., ink-jet printing.

Alternatively, the patterning of the surface with a plurality of seeds may be by forming a film of seeds on the complete surface of a substrate. Once formed, a pattern of a growth solution may be ink-jetted on the surface. A continuous conductive pattern e.g., nanowires, will form only where the pattern of the growth solution meets the pattern of seeds.

The first patterning step, whether patterning with seeds or patterning with a growth solution, may be carried out well before the subsequent step is carried out. In other words, the first patterning step may be carried out in advance; months, weeks, days, hours, minutes before the second step. In some embodiments, the first pattern is pre-formed on a surface region and the second step is carried out on the pre-patterned surface.

The invention further provides a printing process, e.g., by ink-jet printing, wherein one or more process steps are carried out by printing. In some embodiments, each and every application step is carried out by printing, e.g., ink-jet printing, independent of whether or not the patterning results in a pattern of predefined characteristics or is a film that covers the full surface. In other embodiments, the application of a seed solution and/or a growth solution is achieved by printing, e.g., ink-jet printing. As such, each of the solutions: seed solution, growth solution and enhancement solution disclosed herein may be formed into ink solutions that are applied by printing.

Thus, the invention provides ink formulations selected from an ink formulation being a seed solution as described herein, an ink formulation being a growth solution as described herein and an ink formulation being an enhancement solution as described herein. In some embodiments, each of the ink formulations being adapted for printing by a method selected from those disclosed herein. In some embodiments, the ink formulations are inks for inkjet printing.

The continuous and conductive metallic (nanowires) pattern is formed spontaneously at any point of the surface where both the seeds and components of the growth solution come into contact. In some embodiments, the nanowires pattern is formed spontaneously prior to the drying of the second of the two applied solutions (seed solution or growth solution), which is optionally washed and/or dried. Typically, the formation of the continuous conductive (nanowires) pattern does not require the application of any heat or pressure. The pattern may form after applying the growth solution and prior to its drying. In some embodiments, the pattern forms a few minutes after the growth solution has been applied (e.g., between 1 and 20 minutes). In some embodiments, the pattern forms once the solution(s) dry, at ambient conditions, e.g., at room temperature (between 23 and 30° C.). In some embodiments, drying involves heating of the substrate and/or the environment and/or the solution(s) (growth solution and/or seed solution and/or the enhancement solution). In some embodiments, drying is achieved at a temperature between 25-150° C., between 25-100° C., between 25-80° C., between 30-80° C., between 30-70° C., between 30-60° C., between 30-50° C., between 30-40° C., between 50-150° C., or between 50-100° C.

In another aspect, the invention provides a process for the preparation of a film of patterned nanowires on a surface of a substrate, said process comprising:

(a) applying a seed solution on at least one region of a surface of a substrate, wherein the seed solution comprises metal nanoparticles;

(b) applying a growth solution on the at least one region of said surface of a substrate, wherein the growth solution comprises at least one metal precursor, at least one reducing agent and optionally, at least one surfactant;

(c) allowing nanowires and/or ultra-thin nanowires to form on the at least one region of said substrate e.g., by allowing the solution(s) to linger for a few minutes and then washing from the surface of a substrate or by allowing the solution(s) to dry; and (d) optionally, applying an enhancement solution on the at least one region of said surface of a substrate, wherein the enhancement solution comprises at least one metal precursor or at least one reducing agent, optionally a weak reducing agent or a combination thereof, the solution may further comprise at least one surfactant;

thereby obtaining a film of nanowires on at least a region of said substrate.

In another aspect, the invention provides a process for the preparation of a film of patterned nanowires on a surface of a substrate, said process comprising:

(a) obtaining a substrate with at least one pre-formed pattern of nanoparticles on at least one region of said surface of a substrate;

(b) applying a growth solution on the at least one region of said surface of a substrate;

(c) allowing nanowires and/or ultra-thin nanowires to form on the at least one region of said substrate e.g., by allowing the solution(s) to linger for a few minutes and then washing from the surface of a substrate or by allowing the solution(s) to dry; and (d) optionally, applying an enhancement solution on the at least one region of said surface of a substrate.

In another aspect the invention provides a process for the preparation of a nanowire (pattern) film on a surface of a substrate, said process comprising:

(a) obtaining a substrate with a pattern of nanoparticles on at least one portion of said surface of a substrate;

(b) applying a growth solution on the at least one region of said surface of a substrate, wherein the growth solution comprises at least one metal precursor, at least one reducing agent and optionally, at least one surfactant;

(c) allowing nanowires and/or ultra-thin nanowires to form on the at least one region of said surface of a substrate e.g., by allowing the solution(s) to linger for a few minutes and then washing from the surface of a substrate or by allowing the solution(s) to dry.

(d) optionally, applying an enhancement solution on the at least one region of said surface of a substrate, wherein the enhancement solution comprises at least one metal precursor or at least one reducing agent, optionally a weak reducing agent or a combination thereof, the solution may further comprise at least one surfactant.

In another aspect, the invention provides a process for the preparation of a film of (patterned) nanowires on a surface of a substrate, said process comprising:

(a) applying one of a seed solution and a growth solution on at least one region of a surface of a substrate, said region having thereon a pattern composed of the other of said seed solution and a growth solution;

(b) allowing nanowires and/or ultra-thin nanowires to form on the at least one region of said surface; and (c) optionally, applying an enhancement solution on the at least one region of said surface, thereby obtaining a film of nanowires on at least a region of said substrate.

As used herein, the term "nanowire(s)" refers to continuous elongated-shape particles (wires), which comprise one or more elemental metal, a metal alloy and/or a metallic compound, e.g., a metal oxide. Nanowires of the invention are those formed on a surface of a substrate as a result from an interaction (by contacting) of a seed from a seed solution and a metal precursor (and optionally other components in a growth solution). The nanowires are not intended to include those accidently formed in solution rather than on the surface region. In some embodiments, the nanowires consist or comprise a metal or an alloy thereof. In some embodiments, the metal is selected from V, Cr, Mn, Fe, Ni, Cu, Zn, Nb, Tc, Au, Pt, Pd, Ag, Mn, Co, Cd, Ta, Re, Os, Ir and Hg. In some embodiments, the metal is selected from gold, silver, copper, nickel, palladium and combinations thereof. In some other embodiments, the metal is gold or silver or combinations thereof.

In some embodiments, the nanowires consist at least one metal as defined. In some embodiments, the nanowires comprise at least one metal as defined. In some embodiments, the nanowires comprise one or more elemental metal, a metal alloy and/or a metallic compound, e.g., a metal oxide. In some embodiments, the nanowires comprises Sc, Ti, V, Cr, Mn, Fe, Ni, Cu, Zn, Y, Zr, Nb, Tc, Ru, Mo, Rh, W, Au, Pt, Pd, Ag, Mn, Co, Cd, Hf, Ta, Re, Os, Ir and Hg.

In some embodiments, each nanowire making up a film or a pattern of the invention comprises or consists gold or silver metal.

The nanowires are on average of an aspect-ratio (the ratio of length of the nanowire to its width) greater than 1,000,000. In some embodiments, the average aspect-ratio is greater than 100,000. In further embodiments, the average aspect-ratio is greater than 50,000. In further embodiments, the average aspect-ratio is greater than 10,000. In still other embodiments, the average aspect-ratio is between 10,000 and 100,000.

In further embodiments, the average aspect-ratio is greater than 100, greater than 500, or greater than 1,000.

The nanowires obtained by the process of the invention may be thick, thin or ultra-thin. The nanowires are additionally or alternatively characterized by an average cross sectional diameter (size) of less than 100 nm. In some embodiments, the cross-sectional diameter is less than 50 nm; in other embodiments, less than 10 nm and in further embodiments, the cross-sectional diameter is between 1 and 10 nm, or 1 and 9 nm, or 1 and 8 nm, or 1 and 7 nm, or 1 and 6 nm, or 1 and 5 nm, or 1 and 4 nm, or 1 and 3 nm. In other embodiments, the nanowire cross-sectional diameter is 1 nm, or 2 nm, or 3 nm, or 4 nm, or 5 nm, or 6 nm, or 7 nm, or 8 nm, or 9 nm, or 10 nm.

The process of the invention may form a film comprising nanowires and/or ultrathin nanowires.

Generally, a "nanowires film" produced according to the invention comprises a plurality of metal nanowires, which may or may not be ultrathin, or which comprises a mixture of ultrathin nanowires with nanowires having thicker diameters or cross sections. The nanowires in a film of the invention may be arranged as separate nanowires, randomly distributed and/or directionally oriented. The nanowires within a film may be arranged individually, as separate nanowires, i.e., each being randomly orientated, or as clusters (bundles) of nanowires, wherein each cluster comprises two or more co-directionally oriented nanowires (said two or more nanowires are oriented along the same axis or generally run parallel to each other). The nanowires in a typical cluster are arranged within an organic template formed by the surrounding surfactant material. The surfactant may be arranged as bilayers between each two nanowires, thereby defining the distance between each two nanowires. In some embodiments, the nanowires within the cluster are homogeneously spaced. The distance (space) between each two nanowires (i.e., inter-wire spacing) within the cluster is in the order of a few nanometers. In some embodiments, the distance is less than 20 nm. In other embodiments, the distance is 1 or 2 or 3 or 4 or 5 or 6 or 7 or 8 or 9 or 10 nm. In some embodiments, the nanowires in a film are arranged in clusters or at least a number of nanowires are arranged in a cluster.

The nanowire cluster may comprise 100 or more nanowires or up to 100 nanowires. In some embodiments, the nanowire cluster comprises up to 10 nanowires. In further embodiments, the nanowire cluster comprises between 10 and 100 nanowires. In further embodiments, the nanowire cluster comprises between 1 and 20 nanowires. In further embodiments, the nanowire cluster comprises between 1 and 10 nanowires. In still other embodiments, the nanowire cluster comprises 2 or 3 or 4 or 5 or 6 or 7 or 8 or 9 or 10 nanowires. The independent nanowires or clusters thereof may also take on the form of a mesh, namely a formation of closely spaced and randomly crossing metal nanowires, said mesh being conductive throughout, namely at any two arbitrary points thereof.

The "ultra-thin nanowires" are very thin nanowires, namely having a small diameter or cross section. In some embodiments, the ultra-thin nanowires are nanowires having a diameter equal to or smaller than 3 nm or equal to or smaller than 2 nm or equal to or smaller than 1 nm. Thus, a film of ultra-thin nanowires comprises or consists such nanowires.

The process of the invention enables the formation of nanowire films which are patterned and which may be controlled. The nanowires are grown only when a pattern of a plurality of seeds and a pattern of a growth solution are applied, one on top of the other or one in contact with the other, in any sequence of steps as disclosed herein. As such, the process of the invention in fact enables the formation of a novel controlled nanowires film, which may be structured and formed according to a previously formed template (in the form of pre-formed, or pre-determined, pattern of plurality of seeds and/or growth solution).

Therefore, another aspect of the invention provides a nanowire film.

The nanowire film may adopt or comprise or consist of any pattern. The pattern as well as the density of the nanowires are determined based on, inter alia, the end application. In some embodiments, the pattern comprises randomly oriented nanowires on a surface region of the substrate. In some embodiments, the nanowires are patterned into a desired shape and size. The pattern may be of any shape and size. In some embodiments, the pattern of nanowires is an ordered array (e.g., grid, mesh, lines, circles, rectangles, squares, etc). In some embodiments, in the pattern of nanowires the nanowires are aligned in a substantially single direction, e.g., parallel alignment of the nanowires in the film.

In some embodiments, the pattern covers the full surface of a substrate. In some embodiments, the patterned film covers the full surface of a substrate. In other embodiments, the pattern is a continuous pattern on said substrate or a plurality of spaced apart patterns on said substrate The pattern may be in the form of an array of micrometer width lines (or other pattern feature), wherein each or several of the lines are a collection of ultrathin nanowires. In some embodiments, the width is in the order of a micrometer or sub-micrometer. In some embodiments, the width is between 1,000 micron to 0.01 micron. In some embodiments, the width is between 1,000 micron to 0.1 micron. In some embodiments, the width is between 100 micron to 0.1 micron. In some embodiments, the width is between 100 micron to 1 micron.

In some embodiments, the invention provides a transparent nanowire film. In some embodiments, the invention provides a conductive nanowire film. In some embodiments, the invention provides a transparent conductive nanowire film.

In some embodiments, the sheet resistance of a nanowire film according to the invention is below 1,000 $\Omega$/square. In other embodiments, the sheet resistance is below 700 $\Omega$/square. In other embodiments, the sheet resistance is below 500 $\Omega$/square. In further embodiments, the sheet resistance is below 100 $\Omega$/square. In other embodiment, the sheet resistance is 1000 to 10 $\Omega$/square. In other embodiment, the sheet resistance is between 700 and 10 $\Omega$/square. In other embodiment, the sheet resistance is 500 to 10 $\Omega$/square. In still other embodiments, the sheet resistance is 700 to 50 $\Omega$/square. In still other embodiments, the sheet resistance is 500 to 50 $\Omega$/square. In still other embodiments, the sheet resistance is 200 to 10 $\Omega$/square. In still other embodiments, the sheet resistance is 100 to 10 $\Omega$/square and in yet additional embodiments, the sheet resistance is about 100 $\Omega$/square.

The nanowire film may have high transparency to light due to the low volume filling of the metal in the film; in other words, the low surface occupation of a small surface area by the nanowires allows for only a small reduction (if any) in the light transparency as compared to the bare surface. The nanowire film may be transparent in the visible and/or in the near IR and/or IR spectral regime. The nanowire film may be transparent between 400-800 nm.

In some embodiments, light transmission of a nanowire film according to the invention is at least 75%. In some embodiment, light transmission is at least 80%, at least 85% or at least about 90%. In some embodiments, the transmission is between 75 and 98%, between 80 and 98%, between 85 and 98% or between 85 and 95%.

The invention further provides a device comprising or implementing a pattern or a film, e.g., obtained according to a process of the invention.

The metal nanowires and the conductive nanowire films of the invention may be fabricated into substantially any device. Nanostructures and articles, comprising any film according to the invention, may be used in a variety of applications, such as sensors (such as electrochemical sensors, mechanical sensors, electromechanical sensors), tags or probes, electrodes (such as transparent electrodes), switches, transistors, displays, photovoltaic cells and other electronic or opto-electronic devices.

The structural, chemical and electronic properties of specific metal nanowire or nanowires film may be used in the design and manufacture of a variety of such devices. For some applications, the metal nanowires or films are integrated into a functional component of a device that may be used, in some non-limiting examples, in surface-enhanced Raman scattering, sub-wavelength optical waveguiding, biolabeling, bioanalytics and biosensing. Other general or more specific devices and applications may be as relevant.

As may be needed for a particular application, the metal nanowires of the invention and the film comprising same may be further functionalized to impart the film with certain surface properties. Functionalization of the conductive nanowire film may be through functionalization of the metal nanowires or through functionalization of the exterior surfaces of the film. For certain applications, the nanowire film may also comprise at least one additional additive selected from pigments, semiconductor materials, binders, and others. The additive may be introduced into the precursor solution at the beginning of the manufacturing process or may be added to the individual layers after the nanowires have been formed.

The invention thus provides an electrode structure comprising an electrically conductive film comprising a plurality of electrically conductive nanowires on a substrate, which may or may not be optically transparent. In some embodiments, the electrode structure is configured as a photocathode. In other embodiments, the substrate is optically transparent. The film comprising said plurality of electrically conductive nanowires according to the invention may be a portion of a substrate.

The invention further provides a photocathode structure comprising an optically transparent substrate carrying a layer formed by an arrangement (e.g., a mesh) of the conductive nanowires.

An optically transparent electrode is also provided, said electrode comprising a conductive layer, according to the invention, formed by an arrangement of the conductive nanowires on an optically transparent substrate.

The invention also provides an electronic device comprising a nanowire film of the invention. In some embodiments, the electronic device is configured and operable as one or more of the following: as a marker (e.g., unique random pattern of wires having unique distribution/profile of electric and/or magnetic field along the substrate); a sensor (photodetector); a switch (transistor) and other related devices. The electrodes' assembly may be selected from a diode, triode, transistor, a capacitor (which may be between the film and another transparent electrode and may be used e.g., in capacitive touch panels), etc.

Further, the nanowire films of the invention may be integrated in devices that require transmittance of visible, UV, IR, and/or NIR regions of the electromagnetic spectrum, including for example, photoconductors, photodiodes; solar cells; light emitting diodes (LEDs), including organic light emitting diodes and lasers; light sensors, as well as specialized transistors, including organic transistors, inorganic transistors, or hybrid transistors. Other applications for utilization of films of the invention are related to the following categories: printed electronics, touch screens, display backplanes and large or small area flexible applications. Flexible applications further include large area arrays, flexible displays, and e-paper (electronic books, journals, newspapers).

There is thus provided a transistor device wherein at least one of source, drain and gate electrodes comprises an electrically conductive layer in the form of a nanowire film of the invention.

A transistor device is also provided, wherein the device comprises a gate on an insulator structure having an electrically insulating substrate carrying a conductive layer of electrically conductive nanowires according to the invention.

The present invention also provides an electroluminescent screen device comprising a luminescent substrate structure carrying a layer of conductive nanowire film according to the invention.

For some applications it may be necessary to embed the pattern of the invention, e.g., a nanowire film in a solid matrix, with portions of the nanowires extending from the matrix to enable access to a conductive network. Such a matrix may provide protection to the nanowires from adverse factors such as corrosion and abrasion. The matrix may also offer mechanical properties to a layer comprising the conductive nanowire film.

Additionally, performance-enhancing layers may be used to further enhance the characteristics of the nanowire film. Thus, in other embodiments, the invention also provides a multi-layer transparent conductor which comprises a conductive nanowire film of the invention and at least one additional layer selected from an anti-reflective layer, an anti-glare layer, an adhesive layer, a barrier layer, and a protective coat.

The invention thus provides a transparent conductor comprising a substrate and a conductive film on at least a portion of a surface of said substrate, the conductive film comprising a plurality of metal nanowires as disclosed herein, and optionally at least one performance enhancing layer, as disclosed.

In some embodiments, the nanowire conductive film is used for multiple conductors in an integrated circuit chip.

For certain applications, the nanowire film may be treated, during manufacture or after it has been formed with a polymeric surfactant such as a cationic polymeric surfactant, so as to endow the nanowires or the film as a whole with increased physical stability. In some embodiments, the polymeric surfactant is poly-diallyldimethyl ammonium chloride. Alternatively, polymerizable monomers, such as styrene, that can be polymerized after film drying and nanowire formation using a polymerization initiator solution may be employed.

It should be appreciated that certain embodiments of the invention, which are, for clarity, described as distinct embodiments, may also be provided in combination in a single embodiment. Conversely, various features of the invention, which are, for brevity, described in the context of a single embodiment, may also be provided separately or in any suitable combination or as suitable in any other described embodiment of the invention.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIGS. 9A-D provide SEM images CTAB based nanowire stripes, patterned on a PET substrate in lines of ~70 μm wide seed droplets and separated by ~1 mm FIG. 9A) shows the printed lines of seed droplets imaged after silver enhancement, FIG. 9B-D) show, in increasing magnification, grown nanowire stripes, confined to the same width as the seed droplets. The blurred bright areas seen in FIG. 9C-D are due to charging of the insulating areas out of the nanowire stripes.

FIGS. 11A-B show at low magnification, SEM images of greater metal density along the patterned seed lines, due to some seed particles remaining attached to the surface and silver enhanced. FIGS. 11C-D show at higher magnification, SEM images of nanowire films that extend beyond the deposited seed droplet lines, demonstrating bulk solution nanowire growth.

DETAILED DESCRIPTION OF EMBODIMENTS

Figure 1:
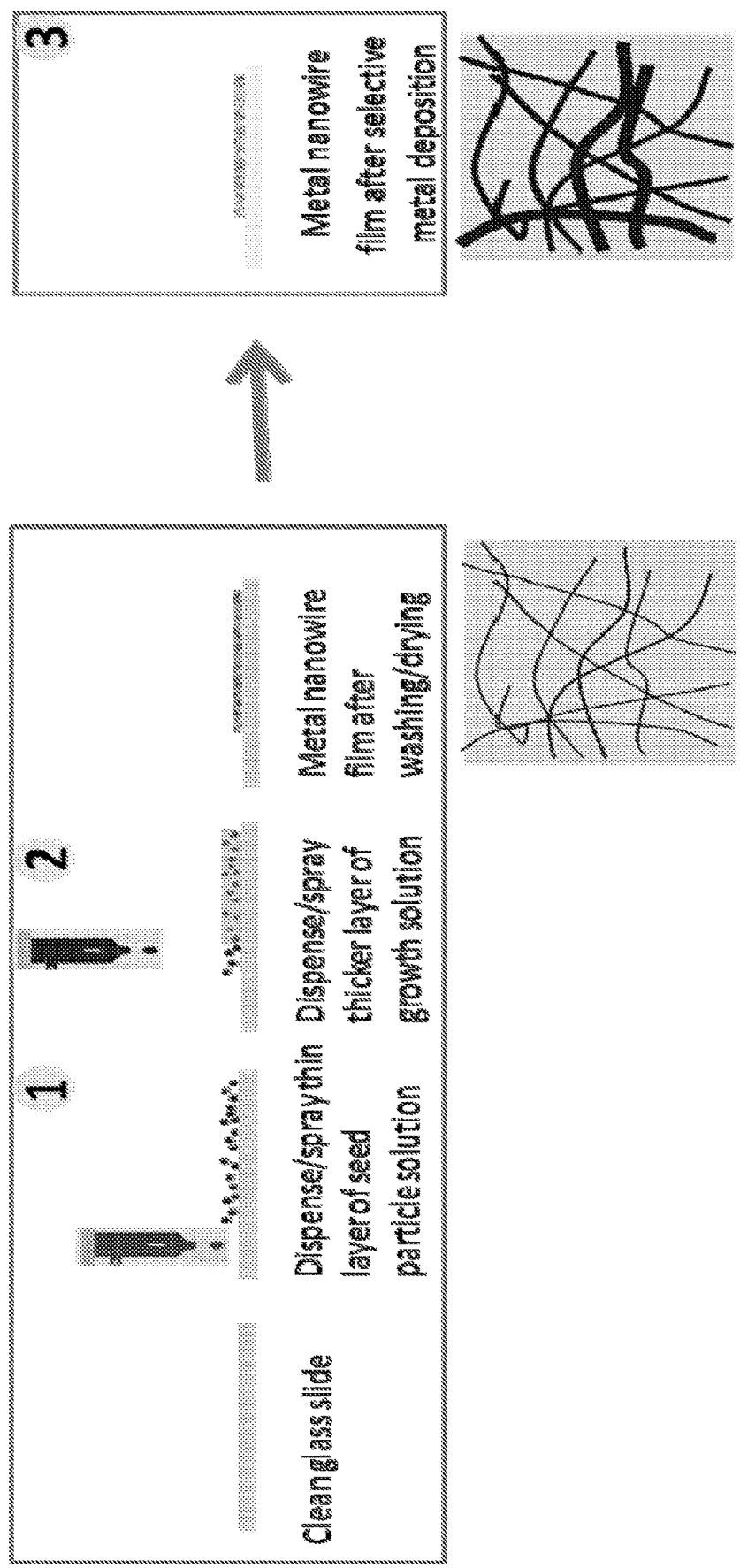
FIG. 1 presents a general scheme of a nanowires printing process according to the present invention.

This invention provides a novel printing process for forming conductive and transparent ultra-thin metal nanowire films (the process scheme can be seen in FIG. 1). This process, which may be achieved by printing, comprises two separate controllable steps: step 1—metal seed particle deposition, and step 2—deposition of a nanowires growth solution. The sequence of the steps shown in FIG. 1 is for purpose of illustration only and is not to be taken as limiting. The sequence, for example, may be reversed.

A third deposition step further improves the film conductivity and stability by, e.g., electroless plating of the nanowires with silver. However, this third step is not generally necessary. In contrast to previous metal nanowire film deposition techniques, where the nanowires were first synthesized and then deposited from a colloidal dispersion, and the micrometer scale nanowires could easily clog ink jetting orifices, the deposition process of the invention involves printing of only 1.5-3 nm size seed particles and aqueous solutions of precursors. It therefore enables reliable deposition by inkjet devices and control over the patterning of the film with high resolution and on a variety of substrates (e.g. PET, glass, etc.).

The separation of the process into two stages, in which a seed particle film is deposited separately from the deposition of a growth solution, allows better control of various film parameters. The fact that the two patterning steps are carried out from separate solutions also prolongs the shelf-life of the two solutions, as neither reacts with the other while in stock. Thus, while the present process permits patterning of the two solutions at different time points, thereby controlling the process conditions, where the two solutions were mixed before deposition, the deposition time would have been limited to several minutes.

The two-stage printing process allows unique in-situ controllable deposition process on many different substrates (e.g. glass and many types of polymers) with a high resolution patterning of the film.

For the formation of ultra-thin metal nanowires directly on a substrate of interest (glass or various polymers), very small metal seed particles (1-4 nm) may be employed. The nanowires formed would typically be ultra-thin (2-3 nm in diameter) and occur in bundles or clusters, where each bundle comprises between one to several hundred of nanowires. To increase the stability of the nanowires a third metal deposition step may be carried out. In some cases, the additional step involves selective electroless silver plating.

The density of the nanowires on the surface can be controlled by the amount of the deposited seed particles and growth solution specifications. The parameters of the electroless metal deposition step would determine the final thickness of the metal nanowires; hence determine the final sheet resistance and transparency of the film.

This process of the invention is highly advantageous as compared with similar processes of the art, at least in the following:

1. In processes of the art the nanorods/nanowires are coated by an insulating polymer (typically PVP) so that electrical contacts may not form between them.

2. The pre-formed, typically micron scale long nanowires, can easily clog inkjet printing nozzles, especially if small orifice nozzles are used for high resolution patterning. In the process of the invention, the largest objects may be the 1-3 nm seed particles utilized for the patterning.

3. Nanowires formed by the other processes have typically diameters greater than 50 nm, causing substantial light scattering (hence haze). However, nanowires of the invention, even after controlled thickening typically have thicknesses below 50 nm. Therefore less haze is expected.

Inks made of dispersions of large nano-objects like the silver/copper nanowires are very difficult to prepare, and dispense by inkjet. With the technology of the invention simple solutions are utilized—no clogging problems, hence no need for special orifice cleaning procedures that one would use when working with large metal nanoparticle dispersions Experimental
  Chemicals.

The reagents used for the metal nanowires synthesis, including BDAC, CTAB, HAuCl$_4$, AgNO$_3$, ascorbic acid, sodium ascorbate, bovine serum albumin (BSA), citric acid, trisodium citrate, hydroquinone and sodium borohydride (NaBH$_4$) were purchased from Sigma-Aldrich and used without any further purification. The Au seeds ("Nanogold") were purchased from Nanoprobes Inc. and used without further treatment. All water used was ultrapure (18 MΩ·cm), obtained from a USF ELGA UHQ system.

Method 1

Step 1: A Metal Seed Particles Solution is Printed on a Specific Desired Area on the Substrate Small seed nanoparticles of different types were used:

1. Commercial gold nanoparticles ("Nanogold"): ~1.4 nm (~55 gold atoms). Produces by Nanoprobes Inc.

2. Homemade silver nanoparticles of ~3.5 nm were made according to: Zhaoxia Qian and So-Jung Park [4].

Ag seeds were synthesized by mixing 4.75 mL of 0.1 M BDAC and 200 μL of 0.01 M $AgNO_3$ in a 15 mL aluminum-foil-wrapped plastic vial at 30° C., followed by a quick injection of 600 μL of 0.01 M ice-cold fresh $NaBH_4$ solution. The solution was gently mixed and left undisturbed at 30° C. for 2.5 h and used immediately without further aging.

$10^{-8}$M or $10^{-7}$M solution of seeds in a mixture of 1:1 water and methanol was used for printing a pattern where the growth of the nanowire film is desired, on various types of substrates (glass, poly(ethylene terphtalate) (PET) etc.).

Figure 2A:
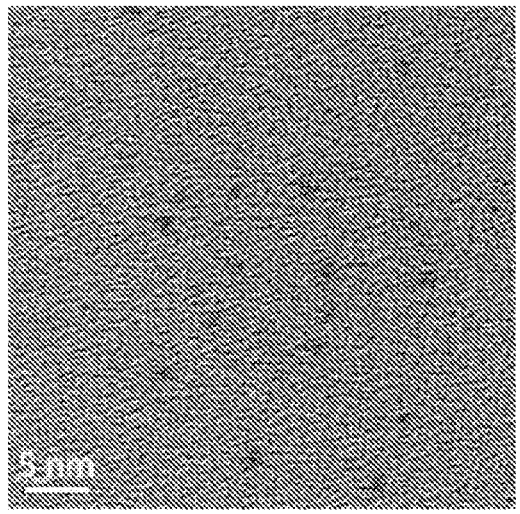
FIGS. 2A-B present TEM images of FIG. 2A—gold nanoparticles and FIG. 2B-silver nanoparticles used as seed particles in a nanowire production process according to the invention.
Figure 2B:
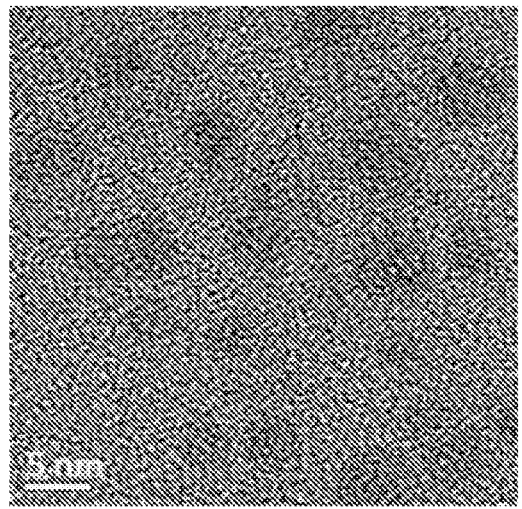

The gold nanoparticles are in average size of 1.4±0.3 nm as can be seen from the TEM image (FIG. 2A). The silver nanoparticles are in average size of 3.6±1.3 nm as can be seen from the TEM image (FIG. 2B). Typical seed particle coverage was about 100 particles per a square micrometer.

Step 2: A Growth Solution Deposited on the Seeds Pattern is Used to Create the Nanowires at the Same Location Deposition of a nanowires growth solution may be carried out either only where the seed solution was deposited or uniformly over the whole substrate. In any case the nanowire film would grow only where the seed particles were deposited. Three types of growth solutions using two different surfactants were used:

BDAC Growth Solution:

The growth solution was prepared according to Zhaoxia Qian and So-Jung Park [4]. The growth solution was prepared by mixing aqueous solutions of BDAC (0.1 M, 10 mL), $HAuCl_4$ (0.01 M, 421 μL), $AgNO_3$ (0.01 M, 512 μL), and ascorbic acid (0.1 M, 268 μL) sequentially at 30° C. in a 20 mL glass vial. Usable time of the solution is at least 1 hour (different from the reference).

100-300 μl of the growth solution was deposited on the substrate for 5-40 minutes on various substrates that were held at room temperature up to 80° C. Then the substrate was washed by immersing for 1 minute in methanol and 1 minute in water.

CTAB Growth Solution:

The growth solution was prepared by mixing aqueous solutions of CTAB (0.25M, 10 mL), $HAuCl_4$ (0.025M, 500 μL), $AgNO_3$ (0.1M, 250 μL), and sodium ascorbate (1.8M, 425 μL) sequentially at 35° C. in a 20 mL glass vial.

300 mL of the growth solution was deposited on the substrate for 5 minutes at room temperature on a 2.5×2.5 $cm^2$ area. Then the substrate was washed by dipping for 1 minute in 70% ethanol and 1 minute in 100% ethanol.

Mixed CTAB and BDAC Growth Solution:

This growth solution was prepared by mixing aqueous solutions of CTAB (250 mM, 7.5 ml) and BDAC (100 mM, 2.5 ml) at 35° C. in a 20 mL glass vial, and adding aqueous solutions of $HAuCl_4$ (25 mM, 500 μL), $AgNO_3$ (100 mM, 250 μL), and sodium ascorbate (1.8M, 425 μL) sequentially.

300 mL of the growth solution was deposited on the substrate for 5 minutes in room temperature on different substrates (2.5×2.5 $cm^2$). Then the substrate was washed for 1 minute in methanol, 1 minute in 70% ethanol and 1 minute in 100% ethanol.

The nanowires formed at this stage would typically be ultra-thin (2-3 nm diameter) and occur in bundles consisting of anywhere between single wires to hundreds of wires.

Figure 3A:
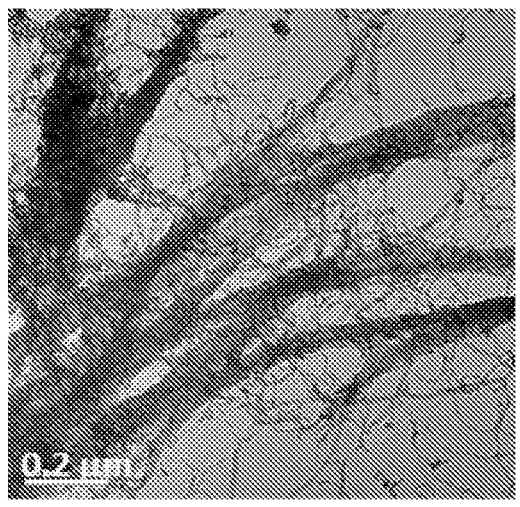
FIGS. 3A-B present TEM images of nanowires formed according to a process of the invention. The nanowires were prepared from FIG. 3A—gold seeds and FIG. 3B-silver seeds.
Figure 3B:
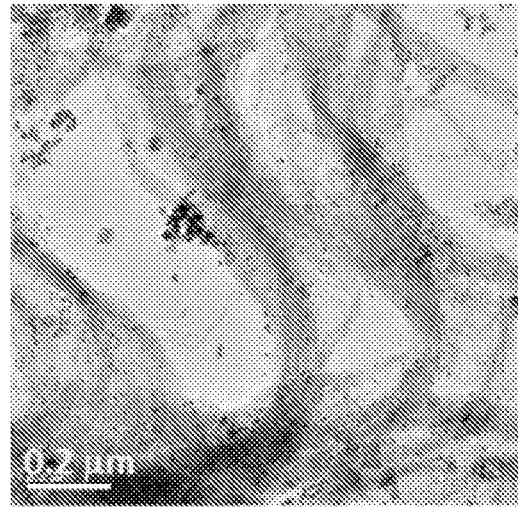

Nanowires prepared from gold seeds and silver seeds with the same growth solution can be seen in FIGS. 3A and 3B, respectively. After this step the sample sheet resistance is in the order of 300-700 Ohm sq., and with visible transmission of nearly 100% on PET and glass (2.5×2.5 $cm^2$).

Step 3: A Possible Third Step is a Selective Metal Deposition in Order to Enhance the Film Conductivity and Stabilize the Grown Ultra-Thin Nanowires A selective electroless silver plating process (also called silver enhancement) was used in order to thicken and stabilize the ultra-thin nanowires.

A silver enhancement solution was prepared according to either one of two methods:

Method 1:

A solution of 79 mL of 2.7 mM polyvinylpyrrolidone (PVP) (3500 MW) or BSA 0.2-0.8% or BDAC 0.1M or gum Arabic 1% in water was heated to 35-45° C. while stirring. The following solutions were added in the order of their appearance: $AgNO_3$ (0.1 M, 500 μL), 5 mL of 1.2 M Citric acid and 1.6M Citrate buffer (pH-4.5), and Hydroquinone (0.3M, 12.5 mL), sequentially at 30° C. in a 200 mL glass vessel.

The substrates with nanowire film were dipped for 1-10 minutes in the stirred silver enhancement solution. Then the samples were washed for 1 minute in methanol and 1 minute in water.

Method 2:

The silver plating solution was prepared by mixing aqueous solutions of BSA (0.5% w/v, 200 mL), $AgNO_3$ (0.1M, 1110 μL), Citric acid and Citrate buffer (1.2M and 1.6M, 11.11 mL), and Hydroquinone (0.3M, 33 mL), sequentially at 26° C.

The samples were dipped for 4-20 minutes in the silver plating solution. Then the samples were washed for 1 minute in methanol and 1 minute in water.

Microscopy images were taken using Quanta 200 FEG Environmental Scanning Electron Microscope (ESEM) and Philips Tecnai F20 Transmission Electron Microscope (TEM). Sheet resistance was measured with a multimeter using silver paste paint lines at 2 opposite edges of the substrate as conductive contacts. The measurement was carried out by contacting the two silver paste contacts with the multimeter electrodes.

Optical transmission for nanowire films deposited on a substrate was measured against a reference clean substrate in a spectrophotometer (Ocean Optics, S2000) at a wavelength range of 400-800 nm. Each sample was measured in several places and the averaged value is the sample's transmission.

Seeds and growth solutions were printed using Jetlab4® system of MicroFab Technologies Inc. Drop volume and diameter were in the range of 150-300 pL and 60-80 μm, respectively.

After the nanowires preparation (step 2), the nanowires would not be stable over time and a third metal deposition step would be required. The last step has to be selective to thicken the pre-formed nanowires without depositing metal elsewhere on the substrate.

The inventors have used a selective electroless silver plating process (called silver enhancement) to thicken and stabilize the ultra-thin nanowires. The density of the nanowires on the surface can be controlled by the amount of the deposited seed particles and the parameters of the electroless metal deposition step would determine the final thickness of the metal nanowires, hence the final film's sheet resistance and transparency.

TEM images of the nanowires (prepared from gold and silver seeds) before and after the silver enhancement process can be seen in FIGS. 4A-D. It can be clearly seen that the process was selective and only the nanowires were thickened without metal deposition directly on the substrate. SEM image of nanowires after silver enhancement on 2.5× 2.5 cm² glass substrate can be seen in FIG. 5. The film sheet resistance of this sample was 30 Ohm sq.

After selective metal deposition, the sample sheet resistance was in the range of 40-70 Ohm sq., and with visible transmission of 90% on PET and glass (2.5×2.5 cm²).

Transmission Electron Microscopy (TEM).

All samples for TEM were deposited on carbon-coated copper grids (SPI). A XX mL seeds solution was manually deposited followed by XX mL of growth solution. For the silver coated nanowires, nickel grids were used. Images were recorded using an FEI Tecnai F20 TEM.

Scanning Electron Microscopy (SEM).

SEM measurements were carried out in Quanta200 field emission gun ESEM using the FEI wet-STEM detector. To examine non-conducting substrates (glass, PET), water vapor environment (low vacuum) was used.

Sheet Resistance, Transparency and Haze Characterization.

The optical transmission and haze of the films were measured against a reference blank substrate in a fiber-coupled array spectrophotometer (Ocean Optics, S2000) connected to an integrating sphere, at a wavelength range of 400-900 nm. The haze was calculated from four optical transmission measurements, made by mounting the specimen at the input of the integrating sphere: Haze=$[(T_4/T_2)-(T_3/T_1)]\times 100\%$, where $T_1$ is a measurement of the incident light with no specimen and closed sphere, $T_2$ is a measurement of the total light transmitted through the specimen with a closed sphere, $T_3$ is a measurement of the light scattered by the instrument with no specimen, with an open sphere and a light trap, and $T_4$ is a measurement of the light scattered by the instrument and the specimen, with an open sphere and a light trap.

Sheet resistance measurements were carried out employing a Fluke multimeter using silver paint at the edges of the substrates for defining the contacts.

The density of seed particles deposited on the substrate could be controlled by the concentration of the seed solution, droplet size (via the diameter of the capillary used for dispensing) and the droplet spacing. Typical dispensing capillary size was 80 μm and seed concentration was in the range $4.2\times 10^{-8}$M-$1.8\times 10^{-7}$M. The droplets were typically printed with their rims nearly touching or slightly overlapping to obtain an average surface density of ~1-500 seeds/μm².

Figure 4A:
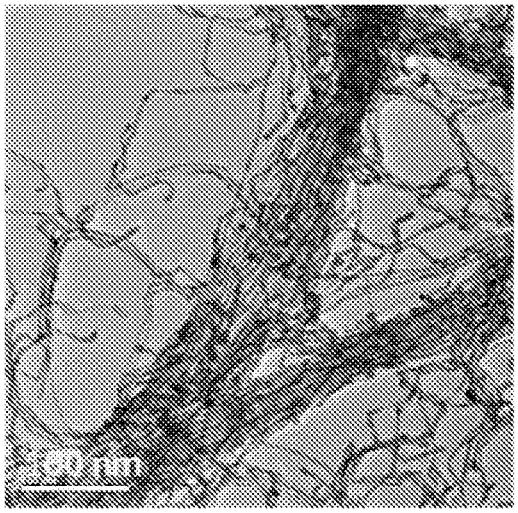
FIGS. 4A-D present TEM images of nanowires prepared using gold seeds and silver seeds before (FIGS. 4A and 4B) and after (FIGS. 4C and 4D) silver enhancement.
Figure 4B:
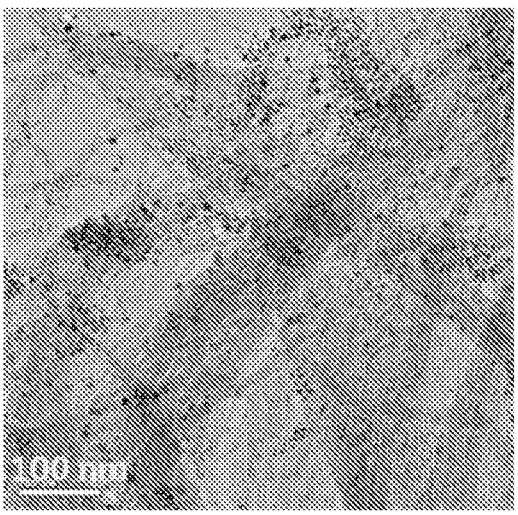
Figure 5:
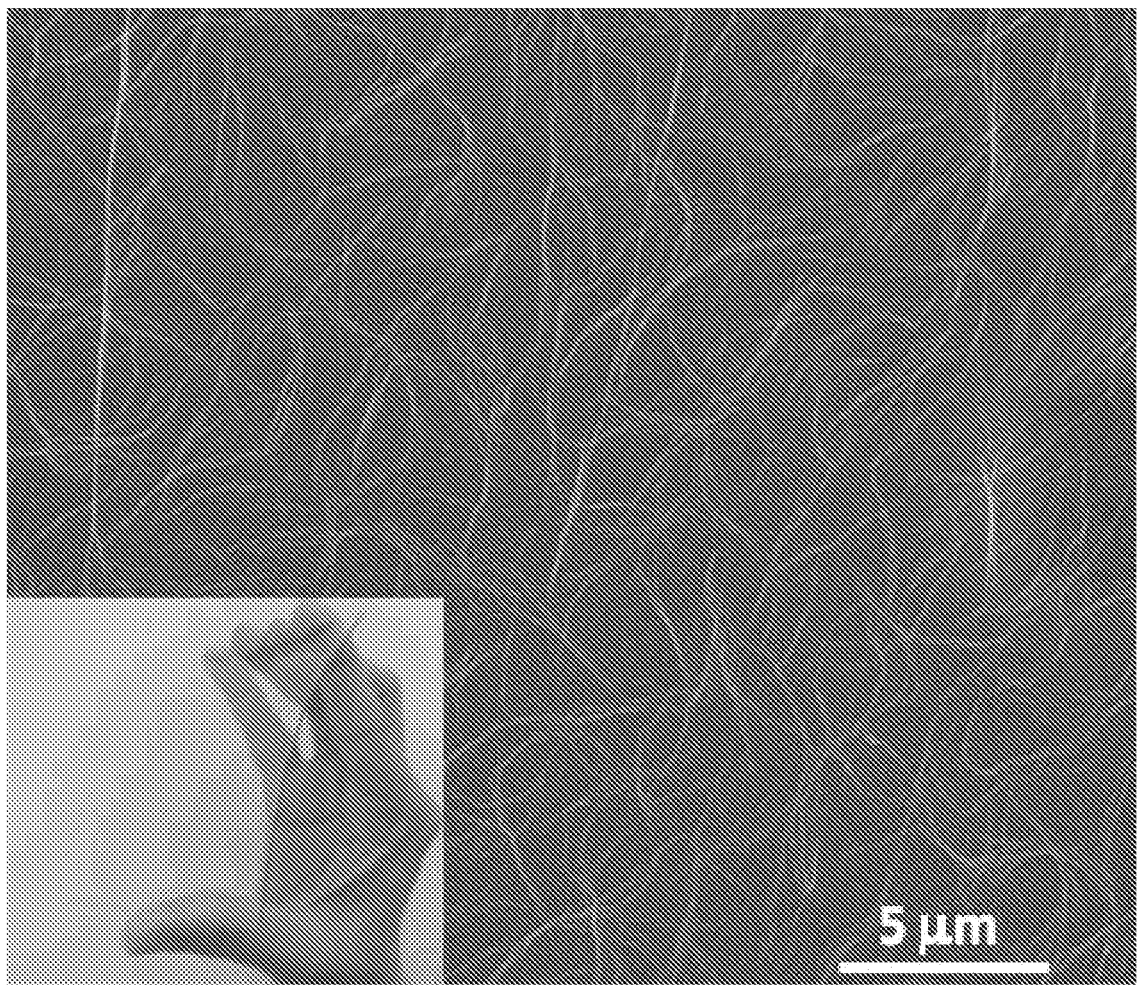
FIG. 5 presents a SEM image of a film of gold nanowires, grown with BDAC solution, after silver enhancement, on a 2.5×2.5 cm$^2$ glass substrate. The measured sheet resistance was 30 Ω/sq. and seed areal density was 60 seeds/μm$^2$. The inset shows a coated 10×10 cm$^2$ PET substrate, demonstrating flexibility and high coating uniformity and optical quality.

After drying the seed solution droplets on the substrate, a typical amount of ~50 μL of the BDAC based growth solution per 1 cm² of seed coated substrate was deposited. This resulted in bundles of ultra-thin (2-3 nm diameter) gold/silver nanowires, as shown in FIGS. 4A-B.

The nanowires formation mechanism using BDAC as the templating surfactant, is initiated in the solution with the reduction of Au(III) ions to Au(I) state by the ascorbic acid molecules. The Au and Ag ions form complexes with the BDAC molecules, which allows for reduction to the final metallic state only in the presence of the catalytic metal seeds particles printed on the surface of the substrate. The nanowires formation mechanism is a self-assembly process occurring in the thin layer of growth solution deposited on the substrate. It should be emphasized that the BDAC based growth solution leads to bulk growth of metal nanowires in the solution volume. On the other hand, CTAB based growth of nanowires, only produces nanowires at the substrate-solution interface ("surface growth"). Hence, The nanowire network which grows in the whole volume of the BDAC based solution is believed to weakly attach to the substrates at random locations, and finally, after washing, flattens on the surface, forming strong van der Waals attraction to the substrate. This will be further illustrated in the discussion of patterned deposition later on.

A selective electroless silver plating process (also called silver enhancement) has been use to thicken and stabilize the ultra-thin nanowires and to enhance the film conductivity. Silver deposition was preferred over the previously used gold deposition (2) since unlike gold, silver does not have interband transitions in the visible range and is therefore more transparent across this range.

Figure 4C:
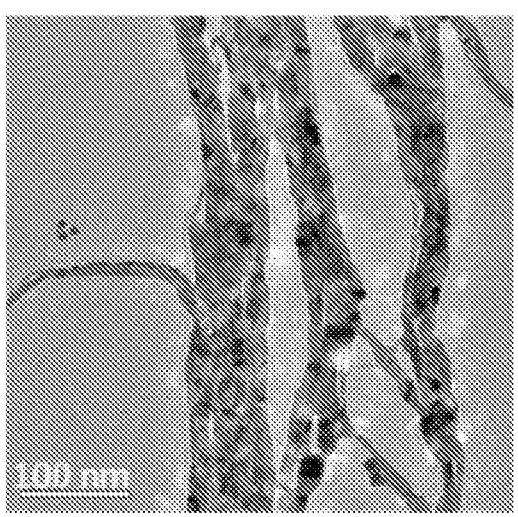
Figure 4D:
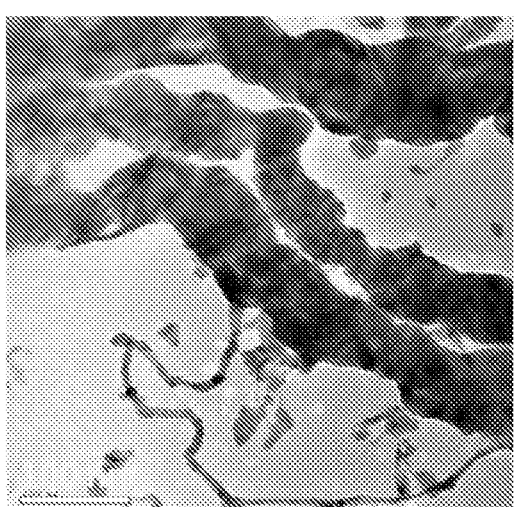

TEM images of the nanowires after the silver enhancement process can be seen in FIGS. 4C-D. Before the silver enhancement the sample sheet resistance is in the order of 1 kΩ/sq. (which degrades over time), and with visible transmission of nearly 100% on PET and glass.

Figure 6:
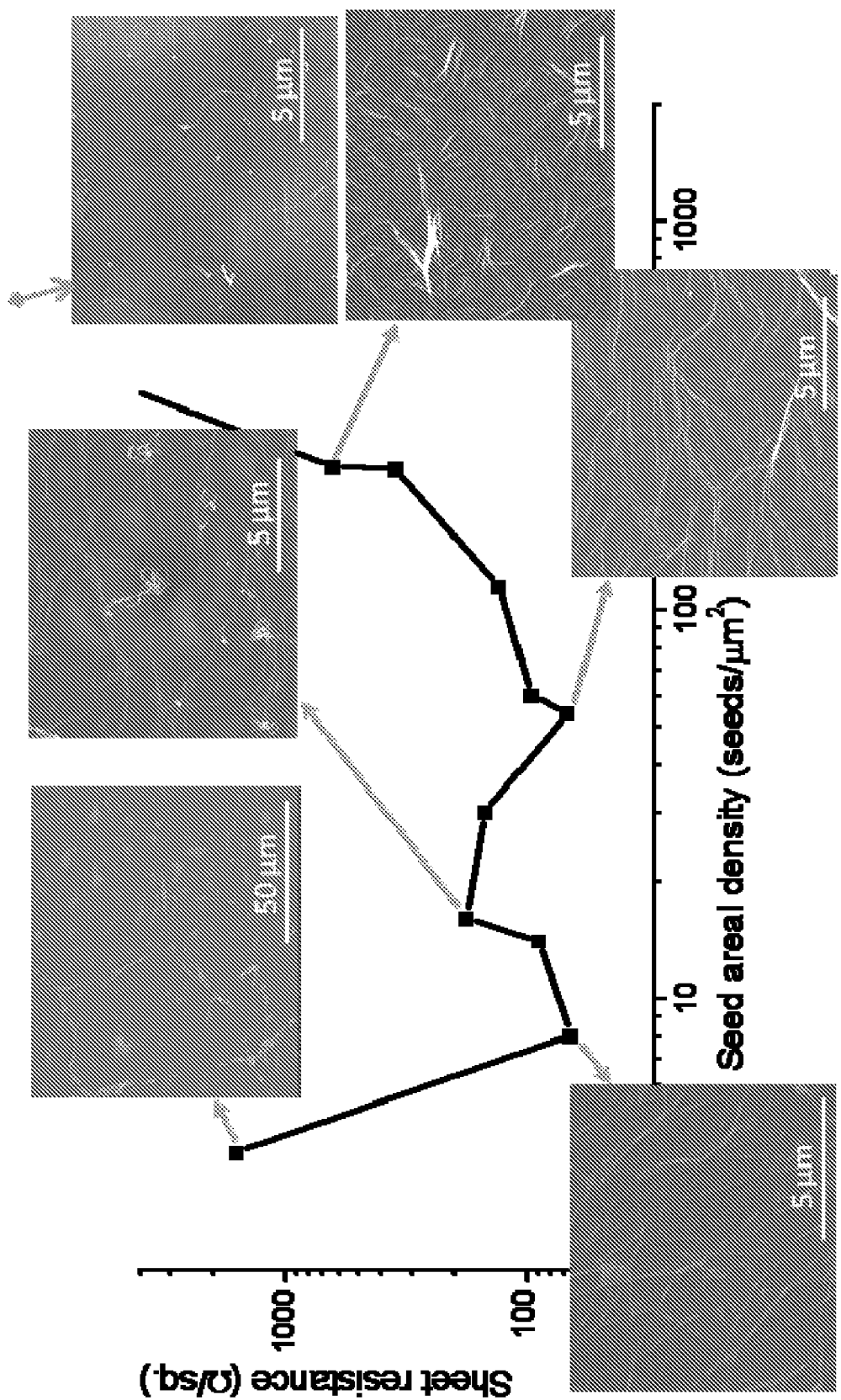
FIG. 6 provides a plot of sheet resistance measured for nanowire films (grown with BDAC, after silver enhancement) vs. number of seeds per 1 μm$^2$ area. The insets are representative SEM images of the films produced at different seed densities.

FIG. 6 presents the results of a study of the influence of the areal density of printed seeds on the nanowires final density and hence on the final sheet resistance. When the density of seeds is very large (~>500 seeds/μm²) or very small <5 seeds/μm²) the sheet resistance rises to very high values (>1 kΩ/sq.) with good correlation to low nanowires density (shown in the inset SEM images). Between ~8 seeds/μm² to ~60 seeds/μm² has obtained relatively low sheet resistance values with high nanowires density.

A significant improvement in conductance and nanowires density occurs when areal density is increased from ~4 seeds/μm² to ~8 seeds/μm². Only ~8 seeds/μm² are needed to grow dense nanowires mesh on 20×20 mm² area with less than 50 Ω/sq.

As the areal density of seeds grows larger than ~60 seeds/μm², more low aspect-ratio particles are seen in the SEM images. It is therefore clear that too high concentration of seed particles interrupts the nanowires growth, probably due to distribution of the deposited gold and silver atoms over too many seed particles.

The seed density/concentration used in the current work is similar to that used by Azulai et al [3], in CTAB based nanowires formation. Their seeds concentration was in the range of $0.67$-$2.1\times 10^{-8}$M. Taking such a concentration in a growth solution comparable to the present work (50 μL per 1 μm²) one obtains the equivalent of ~50-100 seeds/μm². It is therefore concluded that the nanowire growth mechanism seems to be somewhat different between the surface growth mode of the CTAB based system which requires nearly an order of magnitude larger concentration of seed particles compared with the BDAC based system where bulk solution growth requires much less seed particles.

After silver plating the samples (prepared with suitable seeds concentration) sheet resistance was in the range of 30-70 Ω/sq., and with visible transmission of ~90% on PET and glass (2.5×2.5 cm²). SEM image of a nanowire film after silver enhancement on 2.5×2.5 cm² glass substrate can be seen in FIG. 5. The sheet resistance of this sample was 30 Ω/sq. It can be clearly seen that the silver deposition process was selective and only the nanowires were thickened without metal deposition directly on the substrate, and with almost no "satellite" seeds of significant size contaminating the sample after the enhancement process. It is highly probable that some metal particles adsorbed to the substrate prior to the silver coating were washed away from the substrate during the silver deposition or washing steps.

Moreover, using TEM-EDX and SEM-EDX, is has been found that the Au/Ag composition in the metal nanowires before the silver deposition was ~75%/~25%, and after the silver deposition it changed to ~5%/~95%, which together with the TEM images of the silver-coated nanowires proves that a substantial silver layer formed on top of the nanowires.

Figure 7:
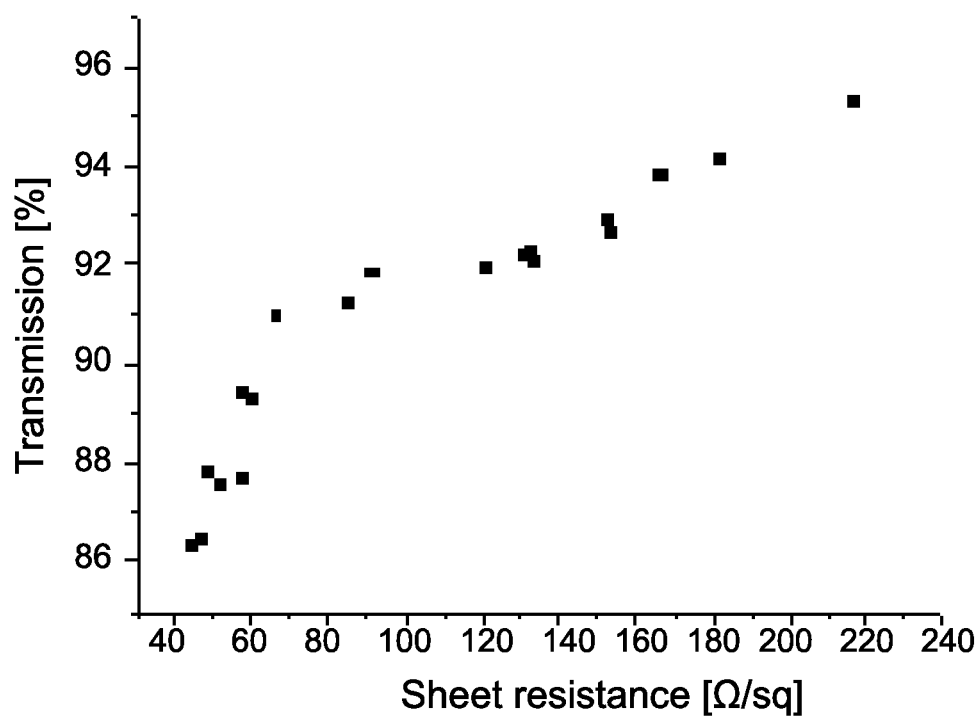
FIG. 7 presents optical transmission vs. sheet resistance for nanowire films prepared with different levels of silver plating and/or density.
Figure 8:
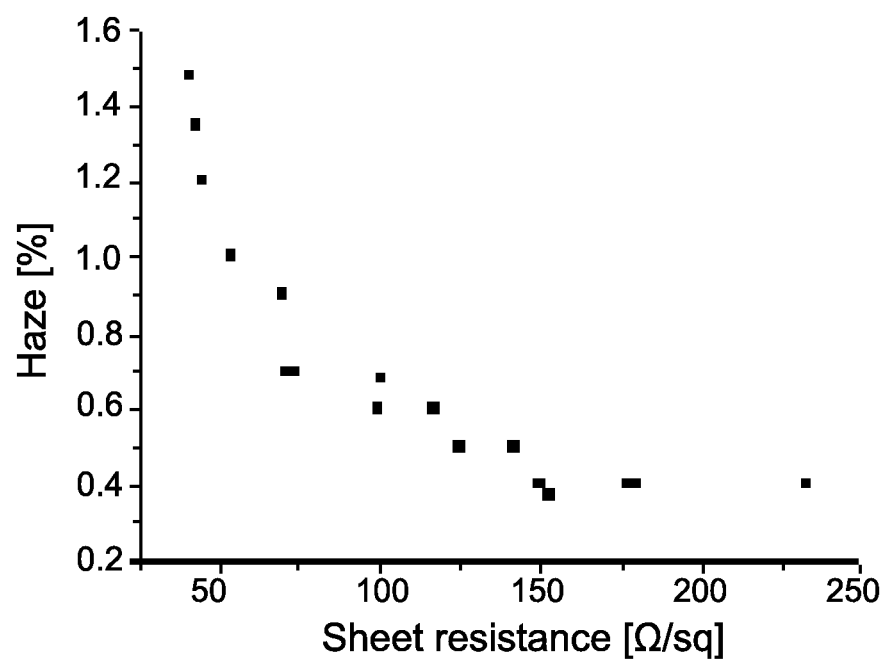
FIG. 8 presents haze vs. sheet resistance for nanowire films at varying amounts of silver plating and/or nanowire density.

FIG. 7 presents optical transmission versus sheet resistance for films deposited on glass and PET. Tunability of the two parameters is achieved through the amount of silver deposited and nanowire density. It can be seen that even at relatively low sheet resistance (~60 Ω/sq.) the transparency is ~90%. Moreover, the haze vs. sheet resistance graph in FIG. 8 shows that relatively low haze is achieved for films (~0.6%) at ~100 Ω/sq., and at lower sheet resistance (~50 Ω/sq.) has reached ~1% haze. There are different slopes to the graphs in FIGS. 7 and 8 above and below ~70 Ω/sq. While sheet resistance drops with the increase in thickness as the diameter squared, light scattering increases as a higher power (~2-6) of the dimension and causes the non-linear increase in light scattering.

Patterning of the Nanowires Films

In order to optimize the nanowire deposition process for narrow line patterns the two nanowire growth modes were compared, "surface growth" using CTAB based solution vs. bulk growth using BDAC based solution. In these experiments single seed droplet thick lines were printed on PET substrates followed by deposition of the nanowire growth solution over the whole substrate, followed by the silver enhancement bath.

Figure 10C:
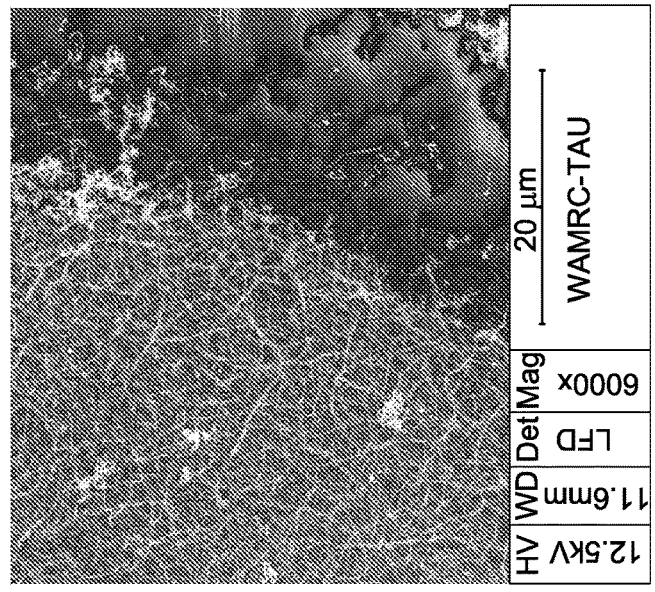
FIGS. 10A-C presents SEM images of CTAB based nanowire film grown on a single seed droplet printed by an 80 μm orifice at the center of a PET substrate, taken after silver plating.
Figure 10B:
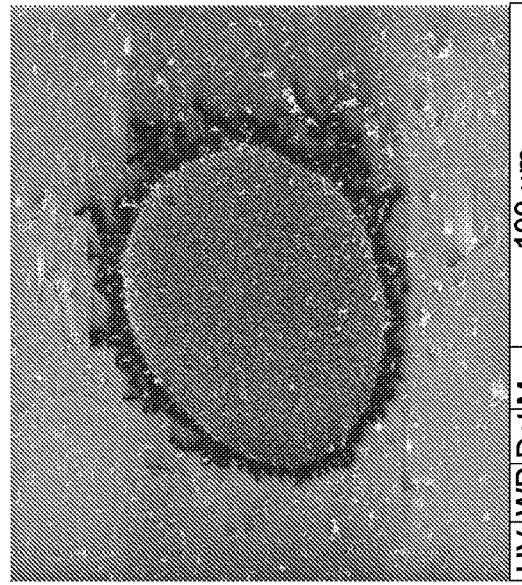
Figure 10A:
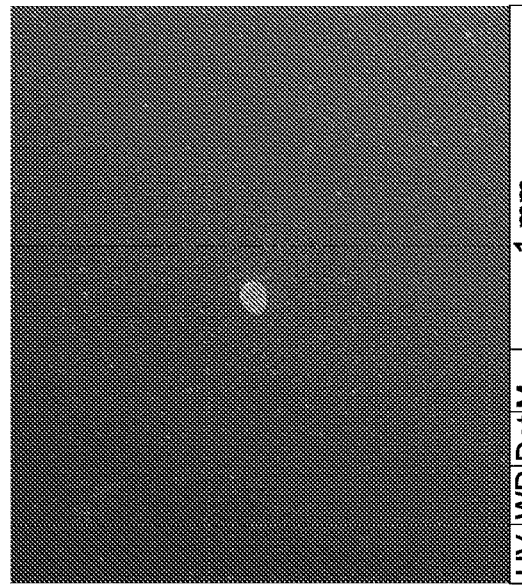

FIG. 9A displays deposited seed spots after silver enhancement of the seed particles to make them visible in high-resolution SEM. The 80:20 water:ethanol droplets, deposited from a 40 μm orifice, spread on the PET substrate to ~70 μm diameter spots. The grown nanowire film stripes were confined to about the same dimension. To further learn about the confined nanowire surface growth mode, a single seed spot was deposited on a PET substrate and the grown nanowires were imaged. As seen in FIG. 10, the nanowires were tightly confined to the ~100 μm seed spot with a fairly sharp edge, where the nanowires abruptly terminate, except for occasional small protrusions of the order of ~10 μm.

Figures 11A, 11B, 11C, 11D:
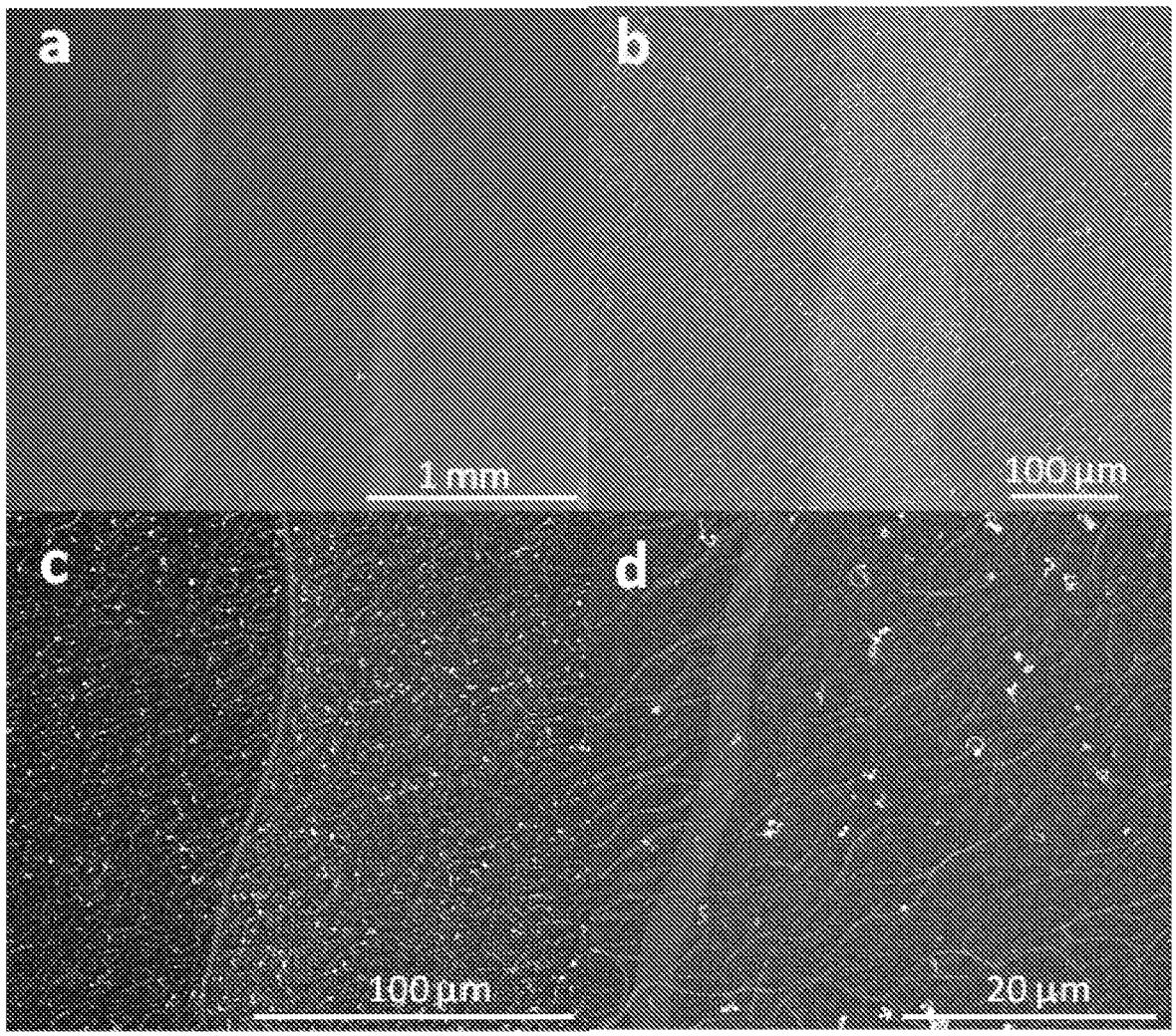
FIGS. 11A-D presents SEM images of BDAC based nanowire films deposited on a PET substrate, with seeds patterned at ~100 μm wide lines (single seed droplet width) and separated by ~1 mm

FIG. 11 displays the results of growing the nanowires over a single seed drop wide line using a BDAC growth solution. The BDAC based nanowires growth is clearly occurring in the bulk solution by seed particles which detached from the substrate and become mobile in the solution through convection and diffusion. BDAC is substantially more soluble in water compared with CTAB and thus accumulates more slowly on the surface when the growth solution touches the substrate. Hence, more seed particle may diffuse deeper into bulk solution film and lead to the nanowire formation away from their original position. With the CTAB based growth solution the seeds are confined to the proximity of the surface due to very fast accumulation of CTAB on the surface, and thus grow at the substrate-solution interface.

Consequently, the CTAB based confined growth is highly suitable for patterning the nanowire films on substrates. As seen in FIGS. 9 and 10, the formed nanowires are constricted to the original spots where the seed particles were deposited.

The difference between the obtained line patterns in the two nanowire growth modes is also demonstrated through conductance measurements. The lines grown with the CTAB growth showed sheet resistance of ~50 Ω/sq. along the lines and no conductivity was measured in the perpendicular direction (across the printed lines). On the other hand, the lines grown with BDAC showed higher sheet resistance along the lines (>100 Ω/sq.) and finite conductance has been measured also perpendicular to the printed lines.

It is clear that various combinations of the two surfactants within the growth solution may be used to control the nanowire density and their spread on the substrate, as well as the required thickness of growth solution needed for optimal nanowire growth.

The separated seed deposition and nanowire growth steps allow a tightly controllable printing mode on a variety of substrates, in particular, using small diameter orifices for inkjet printing of the seed solution should enable patterning of the nanowire films with <100 μm features (possibly down to 20-30 μm). The density of the nanowires on the surface can be controlled by the amount of the deposited seed particles (2) and the time of growth and the parameters of the silver plating step would determine the final thickness of the metal nanowires, hence the final film sheet resistance and transparency.

The invention claimed is:

1. A process for forming a transparent and conductive metal nanowire film on a surface region of a substrate, the process comprising:
   (a) applying on at least one surface region of a substrate a solution comprising metal seeds;
   (b) applying a growth solution on the at least one surface region, wherein the growth solution comprises at least one metal reducing agent, and at least one surfactant, and wherein the growth solution is free of metal seeds; and
   (c) allowing formation of a metal nanowire film in a region where both the solution comprising metal seeds and the growth solution have been applied,
   wherein said solution comprising metal seeds or said growth solution further comprises at least one metal precursor, wherein the metal seeds and the at least one metal precursor are of the same metal element; and
   wherein the metal nanowire film comprises a plurality of metal nanowires formed in said the at least one surfactant.

2. The process according to claim 1, wherein the solution comprising metal seeds is deposited by printing to obtain a pattern of said seeds; and applying the growth solution onto said pattern of metal seeds.

3. The process according to claim 1, wherein the growth solution and/or the solution comprising metal seeds further comprises at least one metal reducing agent.

4. The process according to claim 1, wherein the solution comprising metal seeds is free of at least one metal reducing agent and/or at least one metal precursor.

5. The process according to claim 1, said process further comprising a step of applying a metal enhancement solution onto the metal nanowire film.

6. The process according to claim 1, wherein the metal seeds comprise a metal selected from the group consisting of Sc, Ti, V, Cr, Mn, Fe, Ni, Cu, Zn, Y, Zr, Nb, Tc, Ru, Mo, Rh, W, Au, Pt, Pd, Ag, Mn, Co, Cd, Hf, Ta, Re, Os, Ir and Hg.

7. The process according to claim 1, wherein the metal seeds consist of a metal selected from the group consisting of Sc, Ti, V, Cr, Mn, Fe, Ni, Cu, Zn, Y, Zr, Nb, Tc, Ru, Mo, Rh, W, Au, Pt, Pd, Ag, Mn, Co, Cd, Hf, Ta, Re, Os, Ir and Hg.

8. The process according to claim 6, wherein the at least one metal precursor is at least one precursor of gold or silver.

9. The process according to claim 1, wherein the solution comprising metal seeds comprises seeds of gold metal and/or silver metal and at least one metal reducing agent selected from the group consisting of metal hydrides; the growth solution comprises at least one metal precursor, at least one reducing agent and at least one surfactant.

10. The process according to claim 1, wherein the process for forming the metal nanowire film is a printing process.

11. The process according to claim 1, wherein the metal nanowire film comprises one or more ultra-thin nanowires having a diameter equal to or smaller than 3 nm.

12. The process according to claim 1, wherein the metal nanowire film having a sheet resistance of below 1,000 Ω/square.

13. The process according to claim 10, wherein the process for forming a metal nanowire film is ink-jet printing.

* * * * *